United States Patent
Maruyama et al.

(10) Patent No.: US 8,334,087 B2
(45) Date of Patent: Dec. 18, 2012

(54) POLYMER, RADIATION-SENSITIVE COMPOSITION, MONOMER, AND METHOD OF PRODUCING COMPOUND

(75) Inventors: Ken Maruyama, Tokyo (JP); Toshiyuki Kai, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 12/834,015

(22) Filed: Jul. 12, 2010

(65) Prior Publication Data

US 2010/0310987 A1    Dec. 9, 2010

Related U.S. Application Data

(63) Continuation of application No. PCT/JP2010/052477, filed on Feb. 18, 2010.

(30) Foreign Application Priority Data

Feb. 19, 2009  (JP) ................................ 2009-037114
Oct. 7, 2009    (JP) ................................ 2009-233808

(51) Int. Cl.
  G03F 7/004    (2006.01)
  G03F 7/028    (2006.01)
  G03F 7/039    (2006.01)

(52) U.S. Cl. .................................................. 430/270.1

(58) Field of Classification Search ............... 430/270.1, 430/326
  See application file for complete search history.

(56) References Cited

U.S. PATENT DOCUMENTS

| | | | |
|---|---|---|---|
| 5,744,537 A | 4/1998 | Brunsvold et al. | |
| 6,057,080 A | 5/2000 | Brunsvold et al. | |
| 6,492,086 B1 | 12/2002 | Barclay et al. | |
| 6,787,289 B2 * | 9/2004 | Yamada et al. | 430/281.1 |
| 6,815,506 B2 * | 11/2004 | Takashima et al. | 525/221 |
| 6,902,875 B2 * | 6/2005 | Nagahara et al. | 430/325 |
| 7,202,010 B2 | 4/2007 | Yamada et al. | |
| 7,700,256 B2 | 4/2010 | Barclay et al. | |
| 2003/0099900 A1 | 5/2003 | Yamada et al. | |
| 2003/0207200 A1 | 11/2003 | Barclay et al. | |
| 2007/0218407 A1 * | 9/2007 | Mizutani et al. | 430/270.1 |
| 2008/0081873 A1 * | 4/2008 | Kanae et al. | 525/63 |
| 2008/0096134 A1 * | 4/2008 | Sugimoto et al. | 430/287.1 |
| 2010/0129738 A1 | 5/2010 | Takemura et al. | |

FOREIGN PATENT DOCUMENTS

| | | |
|---|---|---|
| EP | 0159428 | 10/1985 |
| JP | 59-093448 | 5/1984 |
| JP | 05-188598 | 7/1993 |
| JP | 2001-166474 | 6/2001 |
| JP | 2001-166478 | 6/2001 |
| JP | 2001-194792 | 7/2001 |
| JP | 2002-107551 | 4/2002 |
| JP | 2002-540444 | 11/2002 |
| JP | 2003-107708 | 4/2003 |
| JP | 2005-037668 | 2/2005 |
| JP | 2006-096742 | * 4/2006 |
| JP | 2007-225657 | 9/2007 |
| JP | 2008-039917 | 2/2008 |
| JP | 2008-538618 | 10/2008 |

OTHER PUBLICATIONS

Machine translation of JP 2006-096742 published on Apr. 13, 2006.*
J. V. Crivello, "Cationic Polymerization—Iodonium and Sulfonium Salt Photoinitiators", Advances in Polymer Science, vol. 62, pp. 1-48, General Electric Corporate Research and Development Center, Schenectady, New York, U.S.A, 1984.
International Search Report for corresponding International Application No. PCT/JP2010/052477, Mar. 16, 2010.
Written Opinion of the International Searching Authority for International Application No. PCT/JP2010/052477, Mar. 16, 2010.

* cited by examiner

*Primary Examiner* — Anca Eoff
(74) *Attorney, Agent, or Firm* — Ditthavong Mori & Steiner, P.C.

(57) ABSTRACT

A radiation-sensitive composition includes (A) an acid-dissociable group-containing polymer, and (B) a radiation-sensitive acid generator. The acid-dissociable group-containing polymer (A) includes a polymer that includes a repeating unit shown by a general formula (1) in which $R^1$ represents a hydrogen atom, a methyl group, a fluorine atom, or a trifluoromethyl group, $R^2$ represents a substituted or unsubstituted aryl group having 6 to 22 carbon atoms, Y represents a carbon atom, and X represents an atomic group that forms an alicyclic hydrocarbon group together with Y.

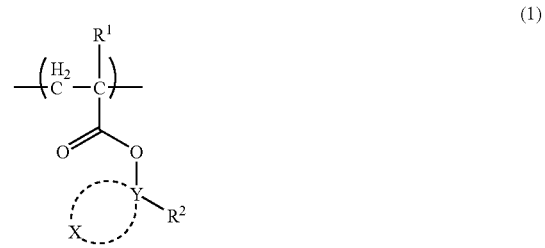

(1)

5 Claims, 2 Drawing Sheets

POLYMER, RADIATION-SENSITIVE COMPOSITION, MONOMER, AND METHOD OF PRODUCING COMPOUND

CROSS-REFERENCE TO RELATED APPLICATIONS

The present application is a continuation application of International Application Number PCT/JP2010/052477, filed Feb. 18, 2010, which claims priority to Japanese Patent Application No. 2009-037114, filed Feb. 19, 2009 and Japanese Patent Application No. 2009-233808, filed Oct. 7, 2009. The contents of these applications are incorporated herein by reference in their entirety.

BACKGROUND OF THE INVENTION

1. Field of the Invention

The present invention relates to a polymer, a radiation-sensitive composition, a monomer, and a method of producing a compound.

2. Discussion of the Background

A semiconductor device (e.g., IC and LSI) production process has utilized microfabrication by means of lithography using a photoresist composition. Along with an increase in the degree of integration of integrated circuits, it has become necessary to form a sub-micron or quarter-micron fine pattern. Therefore, i-lines, KrF excimer laser light, or ArF excimer laser light having a short exposure wavelength has been used instead of g-lines. Lithography that utilizes electron beams, X-rays, or EUV light instead of excimer laser light has also been developed.

Lithography that utilizes electron beams or EUV light is considered to be next-generation or third-generation patterning technology, and requires a positive-tone resist that exhibits high sensitivity and high resolution. In particular, it is very important to increase sensitivity in order to reduce the wafer processing time. However, when increasing the sensitivity of a positive-tone resist that is used for electron beams or EUV light, a deterioration in resolution and nano edge roughness occurs. Therefore, development of a resist that achieves these properties in combination has been strongly desired. Note that the term "nano edge roughness" refers to a phenomenon in which the edge of the resist pattern irregularly changes with respect to the substrate in the direction perpendicular to the line direction due to the properties of the resist, so that a difference occurs between the design dimensions and the actual pattern dimensions when viewed from above. The difference from the design dimensions is transferred by etching using the resist as a mask, and causes a deterioration in electrical properties. As a result, yield decreases. In particular, it is very important to improve the nano edge roughness when forming a fine pattern having a line width of 0.25 μm or less. High sensitivity, high resolution, an excellent pattern shape, and a small degree of nano edge roughness have a trade-off relationship. It is very important to achieve these properties at the same time.

It is also important to achieve high sensitivity, high resolution, an excellent pattern shape, and a small degree of nano edge roughness at the same time when using lithography that utilizes KrF excimer laser light.

As a resist that is suitable for a lithographic process that utilizes KrF excimer laser light, electron beams, or EUV light, a chemically-amplified resist that utilizes an acid catalytic reaction has been mainly used from the viewpoint of increasing sensitivity. As a positive-tone resist, a chemically-amplified resist composition that mainly includes a phenolic polymer (phenolic acid-dissociable polymer) that is insoluble or scarcely soluble in an alkaline solution, but becomes soluble in an alkaline solution due to an acid, and an acid generator has been effectively used.

A resist composition that include a phenolic acid-dissociable polymer obtained by copolymerizing acid-dissociable acrylate monomers, and a compound (sulfonic acid generator) that generates sulfonic acid upon irradiation of active rays or radiation, has been known as such a positive-tone resist. Such positive-tone resist compositions are disclosed in, for example, U.S. Pat. No. 5,561,194, Japanese Patent Application Publication (KOKAI) No. 2001-166474, Japanese Patent Application Publication (KOKAI) No. 2001-166478, Japanese Patent Application Publication (KOKAI) No. 2003-107708, and Japanese Patent Application Publication (KOKAI) No. 2001-194792.

SUMMARY OF THE INVENTION

According to one aspect of the present invention, a polymer includes a repeating unit shown by a following general formula (1),

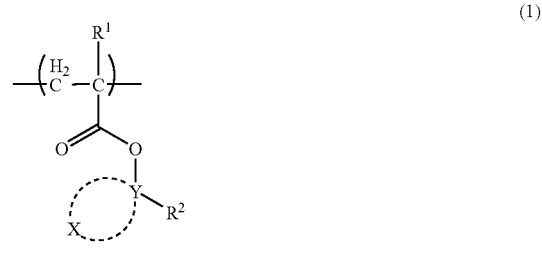

wherein $R^1$ represents a hydrogen atom, a methyl group, a fluorine atom, or a trifluoromethyl group, $R^2$ represents a substituted or unsubstituted aryl group having 6 to 22 carbon atoms, Y represents a carbon atom, and X represents an atomic group that forms an alicyclic hydrocarbon group together with Y.

According to another aspect of the present invention, a radiation-sensitive composition includes (A) an acid-dissociable group-containing polymer, and (B) a radiation-sensitive acid generator. The acid-dissociable group-containing polymer (A) includes a repeating unit shown by a following general formula (1),

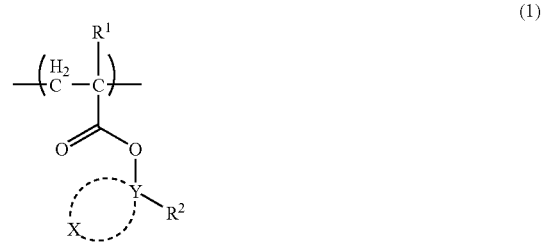

wherein $R^1$ represents a hydrogen atom, a methyl group, a fluorine atom, or a trifluoromethyl group, $R^2$ represents a substituted or unsubstituted aryl group having 6 to 22 carbon atoms, Y represents a carbon atom, and X represents an atomic group that forms an alicyclic hydrocarbon group together with Y.

According to still another aspect of the present invention, a monomer is shown by a following general formula (M-1),

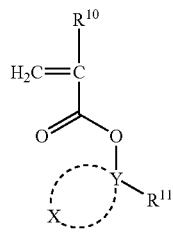
(M-1)

wherein $R^{10}$ represents a hydrogen atom, a methyl group, a fluorine atom, or a trifluoromethyl group, $R^{11}$ represents a substituted or unsubstituted aryl group having 6 to 22 carbon atoms, Y represents a carbon atom, and X represents an atomic group that forms an alicyclic hydrocarbon group together with Y.

According to the other aspect of the present invention, a method includes producing a compound shown by a following general formula (M-1),

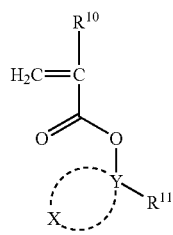
(M-1)

wherein $R^{10}$ represents a hydrogen atom, a methyl group, a fluorine atom, or a trifluoromethyl group, $R^{11}$ represents a substituted or unsubstituted aryl group having 6 to 22 carbon atoms, Y represents a carbon atom, and X represents an atomic group that forms an alicyclic hydrocarbon group together with Y.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
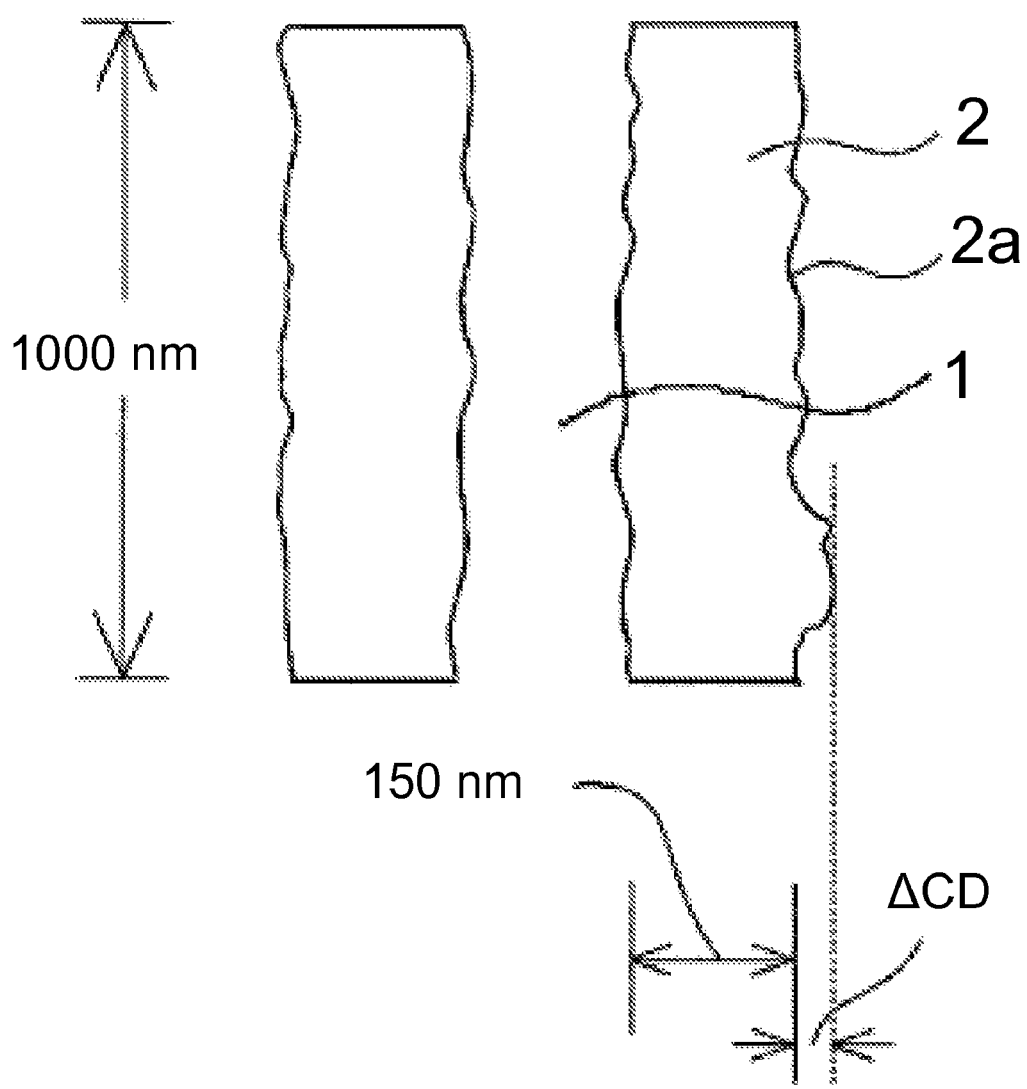
FIG. 1 is a plan view schematically showing a line pattern.

The embodiments will now be described with reference to the accompanying drawings, wherein like reference numerals designate corresponding or identical elements throughout the various drawings.

1. Polymer

A polymer (hereinafter may be referred to as "polymer (I)") according to one embodiment of the invention includes a repeating unit shown by the following general formula (1) (hereinafter may be referred to as "repeating unit (1)").

The polymer (I) is insoluble or scarcely soluble in alkali, but becomes readily soluble in alkali due to an acid. Therefore, the polymer (I) may be suitably used as an acid-dissociable group-containing polymer for a radiation-sensitive composition.

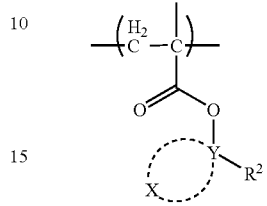
(1)

wherein $R^1$ represents a hydrogen atom, a methyl group, a fluorine atom, or a trifluoromethyl group, $R^2$ represents a substituted or unsubstituted aryl group having 6 to 22 carbon atoms, Y represents a carbon atom, and X represents an atomic group that forms an alicyclic hydrocarbon group together with Y.

The number of carbon atoms of the alicyclic hydrocarbon group formed by X together with Y is not particularly limited, but is preferably 5 to 25, more preferably 5 to 20, and still more preferably 5 to 15.

The alicyclic hydrocarbon group may be monocyclic or polycyclic. Specific examples of the structure of the alicyclic hydrocarbon group include structures shown by the following formulas (a-1) to (a-50), and the like.

(a-1)

(a-2)

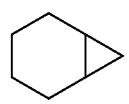
(a-3)

(a-4)

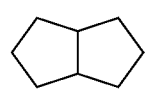
(a-5)

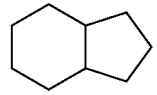
(a-6)

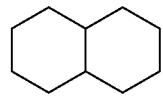
(a-7)

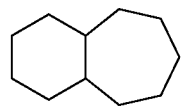
(a-8)

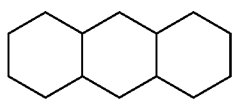
(a-9)
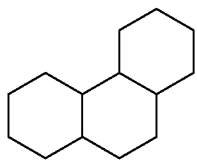
(a-10)
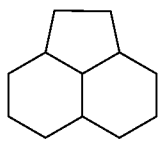
(a-11)
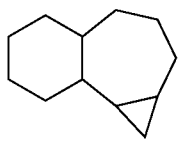
(a-12)
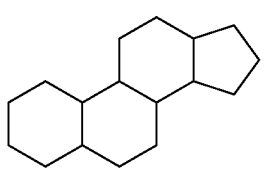
(a-13)
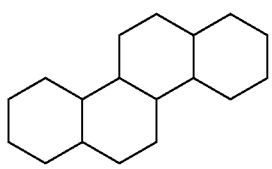
(a-14)
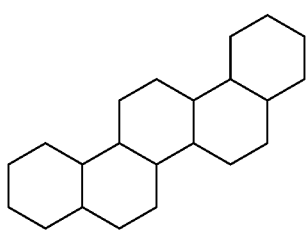
(a-15)
(a-16)
(a-17)
(a-18)
(a-19)
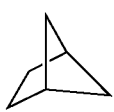
(a-20)
(a-21)
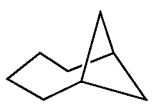
(a-22)
(a-23)
(a-24)
(a-25)
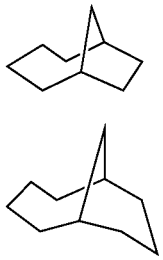
(a-26)
(a-27)
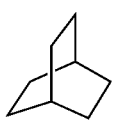
(a-28)
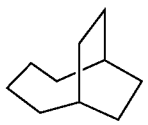
(a-29)
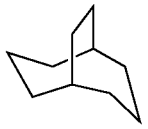
(a-30)
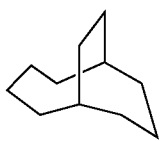
(a-31)

(a-32) 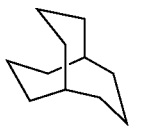

(a-33) 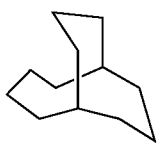

(a-34) 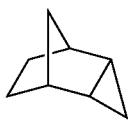

(a-35) 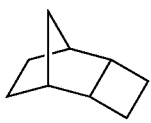

(a-36) 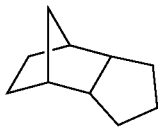

(a-37) 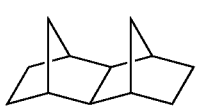

(a-38) 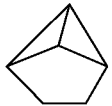

(a-39) 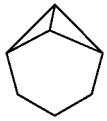

(a-40) 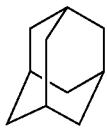

(a-41) 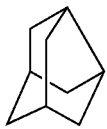

(a-42) 

(a-43) 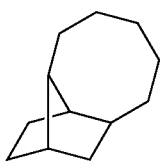

(a-44) 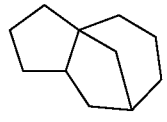

(a-45) 

(a-46) 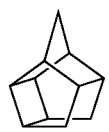

(a-47) 

(a-48) 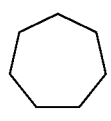

(a-49) 

(a-50) 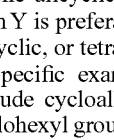

The alicyclic hydrocarbon group formed by X together with Y is preferably a group that has a monocyclic, bicyclic, tricyclic, or tetracyclic structure, etc.

Specific examples of the alicyclic hydrocarbon group include cycloalkyl groups such as a cyclopentyl group, a cyclohexyl group, a cycloheptyl group, a cyclooctyl group, a cyclodecanyl group, and a cyclododecanyl group; an adamantyl group, a noradamantyl group, a decalin residue (decalinyl group), a tricyclodecanyl group, a tetracyclododecanyl group, a norbornyl group, a cedrol group, and the like.

Among these, cycloalkyl groups such as a cyclopentyl group, a cyclohexyl group, a cycloheptyl group, a cyclooctyl group, a cyclodecanyl group, and a cyclododecanyl group; an adamantyl group, a decalin residue, a norbornyl group, and the like are preferable. The alicyclic hydrocarbon group is particularly preferably a cycloalkyl group having 5 to 15 carbon atoms.

The alicyclic hydrocarbon group may be substituted or unsubstituted. Specific examples of the substituent include a methyl group, an ethyl group, a propyl group, a hydroxyl group, a carboxyl group, a halogen atom (e.g., fluorine atom and bromine atom), an alkoxy group (e.g., methoxy group, ethoxy group, propoxy group, and butoxy group), an alkyloxycarbonyl group, and the like.

Examples of the aryl group having 6 to 22 carbon atoms represented by $R^2$ include groups derived from structures shown by the following formulas (x-1) to (x-3), and the like. When $R^2$ represents a group (i.e., naphthyl group) derived from the structure shown by the formulas (x-2), $R^2$ may be bonded to Y in the general formula (1) at the 1-position or the 2-position. When $R^2$ represents a group (i.e., anthryl group) derived from the structure shown by the formula (x-3), $R^2$ may be bonded to Y in the general formula (1) at the 1-position, the 2-position, or the 9-position.

The aryl group may be substituted. Specific examples of the substituent include a methyl group, an ethyl group, a propyl group, a hydroxyl group, a carboxyl group, a halogen atom (e.g., fluorine atom, chlorine atom, and bromine atom), an alkoxy group (e.g., methoxy group, ethoxy group, propoxy group, and butoxy group), an alkyloxycarbonyl group, and the like.

(x-1)

(x-2)

(x-3)

In the polymer (I), the repeating unit (1) may be a repeating unit shown by the following general formula (1-1) (hereinafter may be referred to as "repeating unit (1-1)").

(1-1)

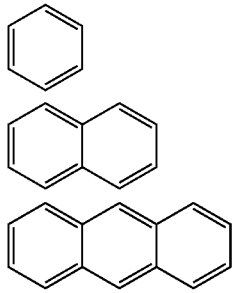

wherein $R^1$ represents a hydrogen atom, a methyl group, a fluorine atom, or a trifluoromethyl group, $R^3$ represents an alkyl group having 1 to 4 carbon atoms, Y represents a carbon atom, X represents an atomic group that forms an alicyclic hydrocarbon group together with Y, and h is an integer from 0 to 3.

Examples of the alkyl group having 1 to 4 carbon atoms represented by $R^3$ in the general formula (1-1) include a methyl group, an ethyl group, an n-propyl group, an i-butyl group, and the like.

h in the general formula (1-1) is an integer from 0 to 3, and preferably 0 or 1.

The description that has been given above in connection with the alicyclic hydrocarbon group formed by X together with Y in the general formula (1) may be applied to the alicyclic hydrocarbon group formed by X together with Y in the general formula (1-1).

The repeating unit (1) may be obtained using a compound shown by the following general formula (M-1) as a monomer, for example.

(M-1)

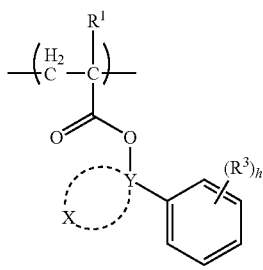

wherein $R^{10}$ represents a hydrogen atom, a methyl group, a fluorine atom, or a trifluoromethyl group, $R^{11}$ represents a substituted or unsubstituted aryl group having 6 to 22 carbon atoms, Y represents a carbon atom, and X represents an atomic group that forms an alicyclic hydrocarbon group together with Y.

The description that has been given above in connection with the aryl group represented by $R^2$ and the alicyclic hydrocarbon group formed by X together with Y in the general formula (1) may be applied to the aryl group represented by $R^{11}$ and the alicyclic hydrocarbon group formed by X together with Y in the general formula (M-1).

The compound shown by the general formula (M-1) (i.e., a monomer according to one embodiment of the invention) may be produced by reacting a compound shown by $CH_2=C(R)C(=O)X$ (wherein R represents a hydrogen atom, a methyl group, a fluorine atom, or a trifluoromethyl group, and X represents a halogen atom) with a compound that can undergo a substitution reaction with X in the above compound.

A production example of a compound (1-1a) that can form the repeating unit shown by the general formula (1-1) is given below. The compound (1-1a) may be produced by reacting a compound (1-phenylcyclohexanol) shown by the following general formula (1-r1) with a compound (methacrylic chloride) shown by the following general formula (1-r2).

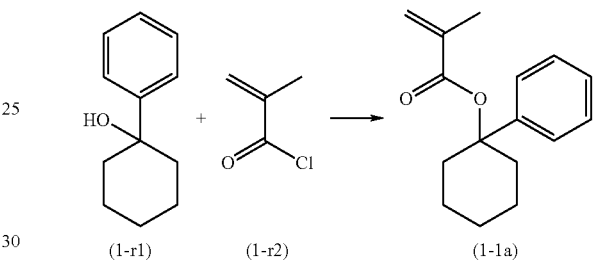

(1-r1)  (1-r2)  (1-1a)

The polymer (I) may include only the repeating unit (1), or may further include at least one of repeating units shown by the following general formula (2) (hereinafter may be referred to as "repeating unit (2)"), the following general formula (3) (hereinafter may be referred to as "repeating unit (3)"), the following general formula (4) (hereinafter may be referred to as "repeating unit (4)"), and the following general formula (5) (hereinafter may be referred to as "repeating unit (5)").

(2)

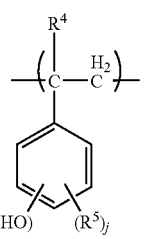

wherein $R^4$ represents a hydrogen atom or a methyl group, $R^5$ represents a monovalent organic group, i is an integer from 0 to 3, and j is an integer from 0 to 3, wherein $0 \leq i+j \leq 5$ is satisfied.

(3)

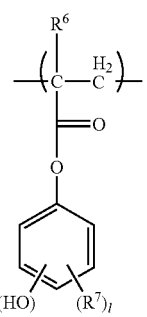

wherein $R^6$ represents a hydrogen atom or a methyl group, $R^7$ represents a monovalent organic group, k is an integer from 0 to 3, and l is an integer from 0 to 3, wherein $0 \leqq k+l \leqq 5$ is satisfied.

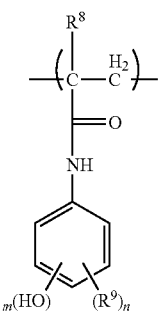

(4)

wherein $R^8$ represents a hydrogen atom or a methyl group, $R^9$ represents a monovalent organic group, m is an integer from 0 to 3, and n is an integer from 0 to 3, wherein $0 \leqq m+n \leqq 5$ is satisfied.

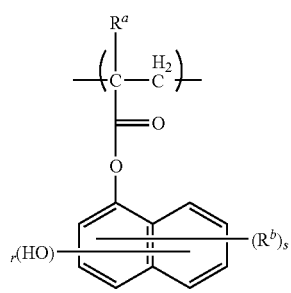

(5)

wherein $R^a$ represents a hydrogen atom or a methyl group, $R^b$ represents a monovalent organic group, r is an integer from 0 to 3, and s is an integer from 0 to 3.

Examples of the monovalent organic group represented by $R^5$ in the general formula (2) include linear or branched alkyl groups having 1 to 12 carbon atoms (e.g., methyl group, ethyl group, n-propyl group, i-propyl group, n-butyl group, 2-methylpropyl group, 1-methylpropyl group, and t-butyl group); linear or branched alkoxy groups having 1 to 12 carbon atoms (e.g., methoxy group, ethoxy group, n-propoxy group, i-propoxy group, n-butoxy group, 2-methylpropoxy group, 1-methylpropoxy group, and t-butoxy group); cycloalkyl groups (e.g., cyclopentyl group, cyclohexyl group, cycloheptyl group, cyclooctyl group, cyclodecanyl group, and cyclododecanyl group); an adamantyl group, a noradamantyl group, a decalin residue (decalinyl group), a tricyclodecanyl group, a tetracyclododecanyl group, a norbornyl group, a cedrol group, and the like. Among these, a methyl group, an ethyl group, an n-butyl group, and a t-butyl group are preferable.

i in the general formula (2) is an integer from 0 to 3, and preferably 0 or 1.

j in the general formula (2) is an integer from 0 to 3, and preferably an integer from 0 to 2.

Specific examples of the repeating unit (2) shown by the general formula (2) include repeating units shown by the following formulas (2-1) to (2-4), and the like.

Note that the polymer (I) may include one or more types of repeating units (2).

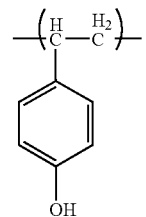

(2-1)

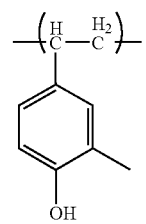

(2-2)

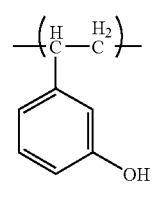

(2-3)

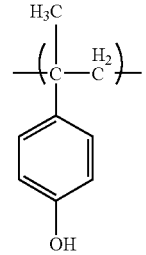

(2-4)

The description that has been given above in connection with the monovalent organic group represented by $R^5$ in the general formula (2) may be applied to the monovalent organic group represented by $R^7$ in the general formula (3).

k in the general formula (3) is an integer from 0 to 3, and preferably 1 or 2.

l in the general formula (3) is an integer from 0 to 3, and preferably 0 or 1.

Specific examples of the repeating unit (3) shown by the general formula (3) include repeating units shown by the following formulas (3-1) and (3-2), and the like.

Note that the polymer (I) may include one or more types of repeating units (3).

(3-1)

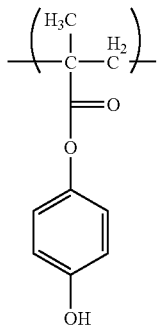

(3-2)

The description that has been given above in connection with the monovalent organic group represented by $R^5$ in the general formula (2) may be applied to the monovalent organic group represented by $R^9$ in the general formula (4).

m in the general formula (4) is an integer from 0 to 3, and preferably 1 or 2.

n in the general formula (4) is an integer from 0 to 3, and preferably 0 or 1.

Specific examples of the repeating unit (4) shown by the general formula (4) include repeating units shown by the following formulas (4-1) and (4-2), and the like. Note that the polymer (I) may include one or more types of repeating units (4).

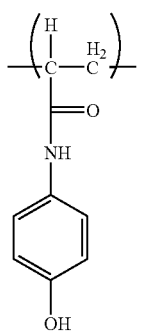

(4-1)

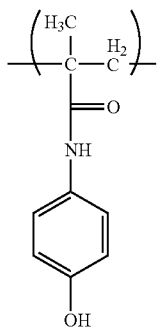

(4-2)

The description that has been given above in connection with the monovalent organic group represented by $R^5$ in the general formula (2) may be applied to the monovalent organic group represented by $R^a$ in the general formula (5).

r in the general formula (5) is an integer from 0 to 3, and preferably 1 or 2.

s in the general formula (5) is an integer from 0 to 3, and preferably 0 or 1.

Specific examples of the repeating unit (5) shown by the general formula (5) include repeating units shown by the following formulas (5-1) and (5-2), and the like.

Note that the polymer (I) may include one or more types of repeating units (5).

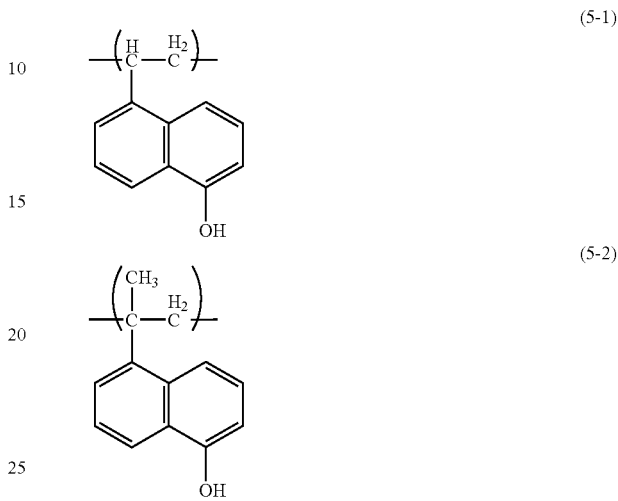

The repeating units shown by the formulas (2-1) to (2-3) may be obtained using the corresponding hydroxystyrene derivative as a monomer. The repeating units shown by the formulas (2-1) to (2-3) may also be obtained using a compound that produces the corresponding hydroxystyrene derivative due to hydrolysis as a monomer.

p-Acetoxystyrene, p-(1-ethoxyethoxy)styrene, and the like are preferable as the monomers used to produce the repeating units shown by the formulas (2-1) to (2-3). When using these monomers, the repeating units shown by the formulas (2-1) to (2-3) may be produced by polymerizing the monomers, and hydrolyzing the side chain of the resulting polymer.

The repeating units shown by the formulas (2-4), (3-1), (3-2), (4-1), (4-2), (5-1), and (5-2) may be obtained using the corresponding monomers.

The monomers used to produce the repeating units shown by the formulas (2-4), (3-1), (3-2), (4-1), (4-2), (5-1), and (5-2) are preferably p-isopropenylphenol, 4-hydroxyphenyl acrylate, 4-hydroxyphenyl methacrylate, N-(4-hydroxyphenyl)acrylamide, N-(4-hydroxyphenyl)methacrylamide, 5-hydroxynaphthalen-1-yl methacrylate, 5-hydroxynaphthalen-1-yl acrylate, or the like.

The polymer (I) may further include a repeating unit derived from a non-acid-dissociable compound (hereinafter may be referred to as "repeating unit (6)") and a repeating unit derived from an acid-dissociable compound (hereinafter may be referred to as "repeating unit (7)") other than the repeating units (1) to (5).

Examples of the non-acid-dissociable compound include styrene, α-methylstyrene, 4-methylstyrene, 2-methylstyrene, 3-methylstyrene, isobornyl acrylate, tricyclodecanyl (meth)acrylate, tetracyclododecenyl (meth)acrylate, compounds shown by the following formulas (b-1) to (b-4), and the like. Among these, styrene, α-methylstyrene, 4-methylstyrene, 2-methylstyrene, 3-methylstyrene, tricyclodecanyl acrylate, and the compounds shown by the formulas (b-1) to (b-4) are preferable.

Note that the polymer (I) may include one or more types of repeating units (6).

(b-1)
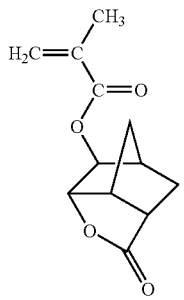

(b-2)
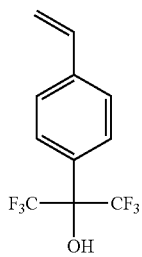

(b-3)
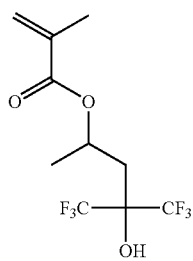

(b-4)
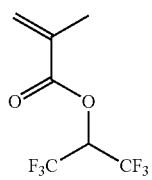

Examples of the acid-dissociable compound include compounds shown by the following general formulas (M-1) and (c-2), and the like.

(c-1)
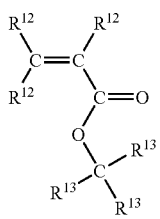

(c-2)
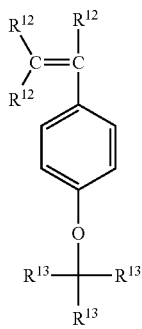

wherein $R^{12}$ represent a hydrogen atom, a methyl group, a trifluoromethyl group, or a hydroxymethyl group, and $R^{13}$ represent a linear or branched alkyl group having 1 to 4 carbon atoms, a monovalent alicyclic hydrocarbon group having 4 to 20 carbon atoms, or a group derived therefrom, or two of $R^{13}$ bond to form a divalent alicyclic hydrocarbon group having 4 to 20 carbon atoms, or a group derived therefrom, together with the carbon atom that is bonded thereto, and one $R^{13}$ other than the two of $R^{13}$ represents a linear or branched alkyl group having 1 to 4 carbon atoms, a monovalent alicyclic hydrocarbon group having 4 to 20 carbon atoms, or a group derived therefrom.

Examples of the linear or branched alkyl group having 1 to 4 carbon atoms represented by $R^{13}$ in the general formulas (M-1) and (c-2) include a methyl group, an ethyl group, an n-propyl group, an i-propyl group, an n-butyl group, a 2-methylpropyl group, a 1-methylpropyl group, a t-butyl group, and the like.

Examples of the monovalent alicyclic hydrocarbon group having 4 to 20 carbon atoms represented by $R^{13}$ include a group that includes an alicyclic ring derived from a cycloalkane (e.g., norbornane, tricyclodecane, tetracyclododecane, adamantane, cyclobutane, cyclopentane, cyclohexane, cycloheptane, or cyclooctane), and the like.

Examples of a group derived from the alicyclic hydrocarbon group include a group obtained by substituting the monovalent alicyclic hydrocarbon group with at least one linear, branched, or cyclic alkyl group having 1 to 4 carbon atoms, such as a methyl group, an ethyl group, an n-propyl group, an i-propyl group, an n-butyl group, a 2-methylpropyl group, a 1-methylpropyl group, or a t-butyl group, and the like.

The alicyclic hydrocarbon group represented by $R^{13}$ is preferably a group that includes an alicyclic ring derived from norbornane, tricyclodecane, tetracyclododecane, adamantane, cyclopentane, or cyclohexane, a group obtained by substituting the group that includes an alicyclic ring with the above alkyl group, or the like.

Examples of the divalent alicyclic hydrocarbon group having 4 to 20 carbon atoms that is formed by two of $R^{13}$ together with the carbon atom that is bonded thereto (i.e., the carbon atom bonded to the oxygen atom) include a cyclobutylene group, a cyclopentylene group, a cyclohexylene group, a cyclooctylene group, and the like.

Examples of a group derived from the divalent alicyclic hydrocarbon group formed by two of $R^{13}$ include a group obtained by substituting the divalent alicyclic hydrocarbon group with at least one linear, branched, or cyclic alkyl group having 1 to 4 carbon atoms, such as a methyl group, an ethyl group, an n-propyl group, an i-propyl group, an n-butyl group, a 2-methylpropyl group, a 1-methylpropyl group, or a t-butyl group, and the like.

Among these, a cyclopentylene group, a cyclohexylene group, a group obtained by substituting a cyclopentylene group or a cyclohexylene group with the above alkyl group, and the like are preferable.

Specific preferable examples of the repeating unit (7) include repeating units shown by the following general formulas (7-1) to (7-8), and the like.

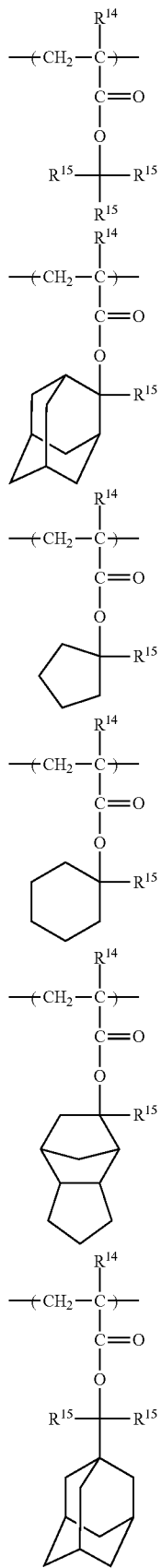

(7-1)
(7-2)
(7-3)
(7-4)
(7-5)
(7-6)

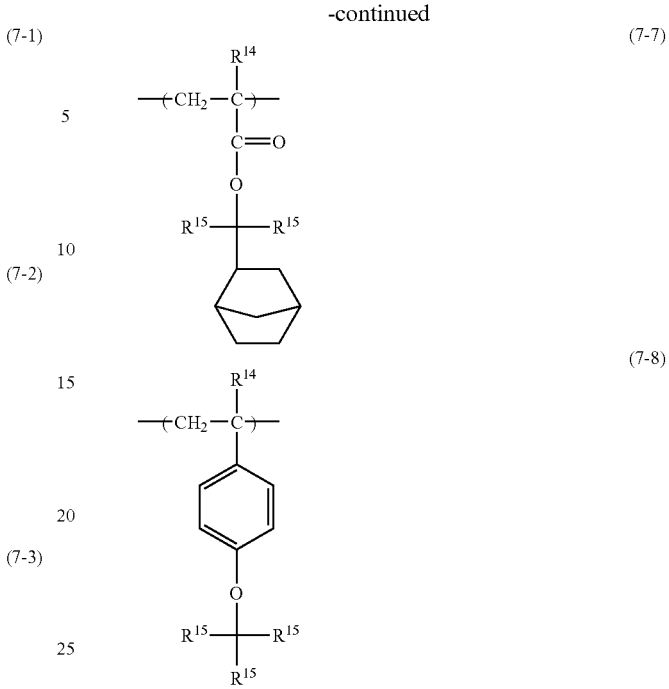

(7-7)
(7-8)

wherein $R^{14}$ represents a hydrogen atom, a methyl group, a trifluoromethyl group, or a hydroxymethyl group, and $R^{15}$ represent a linear or branched alkyl group having 1 to 4 carbon atoms.

Note that the polymer (I) may include one or more types of repeating units (7).

The content of the repeating unit (1) is preferably 1 mol % or more, more preferably 5 to 70 mol %, and still more preferably 5 to 50 mol %, based on the total amount (100 mol %) of the repeating units that form the polymer (I). If the content of the repeating unit (1) is 1 mol % or more, a radiation-sensitive composition that includes the polymer (I) as an acid-dissociable group-containing polymer exhibits a small degree of nano edge roughness.

The total content of the repeating units (2) to (5) is preferably 1 mol % or more, more preferably 5 to 95 mol %, and still more preferably 5 to 80 mol %, based on the total amount (100 mol %) of the repeating units that form the polymer (I). If the total content of the repeating units (2) to (5) exceeds 95 mol %, a radiation-sensitive composition that includes the polymer (I) as an acid-dissociable group-containing polymer may exhibit a large degree of nano edge roughness.

The total content of the repeating units (1) to (5) is preferably 10 mol % or more, more preferably 40 to 100 mol %, and still more preferably 50 to 100 mol %, based on the total amount (100 mol %) of the repeating units that form the polymer (I). If the total content of the repeating units (1) to (5) is 10 mol % or more, a radiation-sensitive composition that includes the polymer (I) as an acid-dissociable group-containing polymer exhibits a small degree of nano edge roughness.

The content of the repeating unit (6) is normally 80 mol % or less, and preferably 0 to 60 mol %, based on the total amount (100 mol %) of the repeating units that form the polymer (I). If the content of the repeating unit (6) is 80 mol % or less, a radiation-sensitive composition that includes the polymer (I) as an acid-dissociable group-containing polymer exhibits resolution and nano edge roughness in a well-balanced manner.

The content of the repeating unit (7) is normally 60 mol % or less, and preferably 0 to 50 mol %, based on the total amount (100 mol %) of the repeating units that form the polymer (I). If the content of the repeating unit (7) is 60 mol % or less, a radiation-sensitive composition that includes the polymer (I) as an acid-dissociable group-containing polymer exhibits resolution and nano edge roughness in a well-balanced manner.

The total content of the repeating units (6) and (7) is 90 mol % or less, and preferably 0 to 80 mol %, based on the total amount (100 mol %) of the repeating units that form the polymer (I). If the total content of the repeating units (6) and (7) is 90 mol % or less, a radiation-sensitive composition that includes the polymer (I) as an acid-dissociable group-containing polymer exhibits resolution and nano edge roughness in a well-balanced manner.

The polymer (I) may be synthesized by an arbitrary method. For example, the polymer (I) may be synthesized by radical polymerization or anionic polymerization. The hydroxystyrene unit (side chain) of the repeating units (2) to (4) may be obtained by hydrolyzing the polymer (I) (e.g., acetoxy group) in an organic solvent in the presence of a base or an acid.

For example, radical polymerization may be implemented by stiffing and heating the monomers such as the compound (M-1) in an appropriate organic solvent under a nitrogen atmosphere in the presence of a radical polymerization initiator.

Examples of the radical polymerization initiator include azo compounds such as 2,2'-azobisisobutylonitrile, 2,2'-azobis(2,4-dimethylvaleronitrile), 2,2'-azobis(4-methoxy-2,4-dimethylvaleronitrile), 2,2'-azobismethylbutyronitrile, 2,2'-azobiscyclohexanecarbonitrile, cyanomethylethylazoformamide, 2,2'-azobis(methyl 2,4-dimethylpropanate), and 2,2'-azobiscyanovaleric acid; organic peroxides such as benzoyl peroxide, lauroyl peroxide, 1,1'-bis(t-butylperoxy)cyclohexane, 3,5,5-trimethylhexanoyl peroxide, t-butyl peroxy-2-ethylhexanoate, and t-butyl peroxypivalate; hydrogen peroxide; and the like.

A polymerization promoter such as 2,2,6,6-tetramethyl-1-piperidinyloxy, iodine, a mercaptan, or a styrene dimmer may optionally be used for radical polymerization.

The radical polymerization temperature is appropriately selected (e.g., 50 to 200° C.) depending on the type of initiator, etc. When using an azo initiator or a peroxide initiator, the radical polymerization temperature is preferably determined so that the half-life of the initiator is about 10 minutes to about 30 hours, and more preferably about 30 minutes to about 10 hours.

The radical polymerization time varies depending on the type of initiator and the reaction temperature, but is preferably determined so that 50% or more of the initiator is consumed (generally about 0.5 to about 24 hours).

Anionic polymerization may be implemented by stirring the monomers such as the compound (M-1) at a given temperature in an appropriate organic solvent under a nitrogen atmosphere in the presence of an anionic polymerization initiator, for example.

Examples of the anionic polymerization initiator include organic alkali metals such as n-butyllithium, s-butyllithium, t-butyllithium, ethyllithium, ethyl sodium, 1,1-diphenylhexyllithium, 1,1-diphenyl-3-methylpentyllithium, and the like.

The anionic polymerization temperature is appropriately selected depending on the type of initiator, etc. When using an alkyllithium, the anionic polymerization temperature is preferably −100 to 50° C., and more preferably −78 to 30° C.

The anionic polymerization time varies depending on the type of initiator and the reaction temperature, but is preferably determined so that 50% or more of the initiator is consumed (generally about 0.5 to about 24 hours).

Note that the polymer (I) may be synthesized by heating the monomers without using the polymerization initiator, or may be synthesized by cationic polymerization.

Examples of an acid used when introducing the hydroxystyrene unit by hydrolyzing the side chain of the polymer (I) include organic acids such as p-toluenesulfonic acid, a hydrate thereof, methanesulfonic acid, trifluoromethanesulfonic acid, malonic acid, oxalic acid, and 1,1,1-fluoroacetic acid; inorganic acids such as sulfuric acid, hydrochloric acid, phosphoric acid, and hydrobromic acid; salts such as pyridinium p-toluenesulfonate, ammonium p-toluenesulfonate, and 4-methylpyridinium p-toluenesulfonate; and the like.

Examples of a base include inorganic bases such as potassium hydroxide, sodium hydroxide, sodium carbonate, and potassium carbonate; organic bases such as triethylamine, N-methyl-2-pyrrolidone, piperidine, and tetramethylammonium hydroxide; and the like.

Examples of the organic solvent used for polymerization or hydrolysis include ketones such as acetone, methyl ethyl ketone, and methyl amyl ketone; ethers such as diethyl ether and tetrahydrofuran (THF); alcohols such as methanol, ethanol, and propanol; aliphatic hydrocarbons such as hexane, heptane, and octane; aromatic hydrocarbons such as benzene, toluene, and xylene; alkyl halides such as chloroform, bromoform, methylene chloride, methylene bromide, and carbon tetrachloride; esters such as ethyl acetate, butyl acetate, ethyl lactate, propylene glycol monomethyl ether, propylene glycol monomethyl ether acetate, and cellosolve; aprotic polar solvent such as dimethylformamide, dimethyl sulfoxide, and hexamethylphosphoroamide; and the like.

Among these, acetone, methyl amyl ketone, methyl ethyl ketone, tetrahydrofuran, methanol, ethanol, propanol, ethyl acetate, butyl acetate, ethyl lactate, propylene glycol monomethyl ether, propylene glycol monomethyl ether acetate, and the like are preferable.

The polystyrene-reduced weight average molecular weight (Mw) of the polymer (I) determined by gel permeation chromatography (GPC) is preferably 1500 to 100,000, more preferably 1500 to 40,000, and still more preferably 2000 to 25,000.

The ratio (Mw/Mn) of the Mw to the polystyrene-reduced number average molecular weight (Mn) of the polymer (I) determined by GPC is normally 1 to 5, preferably 1 to 4, and more preferably 1 to 3.

2. Radiation-Sensitive Composition

A radiation-sensitive composition according to one embodiment of the invention includes (A) an acid-dissociable group-containing polymer, and (B) a radiation-sensitive acid generator.

2-1. Acid-Dissociable Group-Containing Polymer

The acid-dissociable group-containing polymer (hereinafter may be referred to as "polymer (A)") is insoluble or scarcely soluble in alkali, but becomes readily soluble in alkali due to an acid. The expression "insoluble or scarcely soluble in alkali" means that a film (thickness: 100 nm) that is formed only of the polymer (A) has a thickness equal to or more than 50% of the initial thickness when developed under alkaline development conditions employed when forming a resist pattern using a resist film that is formed of a radiation-sensitive composition that includes the polymer (A).

The description that has been given above in connection with the polymer (I) may be applied to the polymer (A).

The radiation-sensitive composition according to one embodiment of the invention exhibits excellent sensitivity due to the acid-dissociable group-containing compound (polymer (A)). The radiation-sensitive composition thus forms a chemically-amplified positive-tone resist film that effectively responds to (extreme) deep ultraviolet rays (e.g., KrF excimer laser light, ArF excimer laser light, or EUV), X-rays such as synchrotron radiation, or electron beams during a lithography process, exhibits a small degree of roughness, exhibits excellent sensitivity and resolution, and can stably and accurately form a fine pattern.

2-2 Radiation-Sensitive Acid Generator

The acid generator (B) generates an acid when applying electron beams, radiation, etc. to the radiation-sensitive composition during a lithography process. The acid-dissociable group of the polymer dissociates due to the acid generated by the acid generator (B).

For example, the acid generator (B) is preferably at least one of onium salts, diazomethane compounds, and sulfonimide compounds in order to achieve excellent acid generation efficiency, heat resistance, etc. These compounds may be used either individually or in combination.

The onium salt is preferably a compound shown by the following general formula (b1).

$$M^+Z^- \quad (b1)$$

wherein $M^+$ represents a monovalent onium cation, and $Z^-$ represents a monovalent anion.

Examples of the onium salt include iodonium salts, sulfonium salts, phosphonium salts, diazonium salts, pyridinium salts, and the like. Among these, a sulfonium cation or an iodonium cation is preferable since improved sensitivity is obtained.

Examples of the monovalent onium cation represented by $M^+$ in the general formula (b1) include monovalent onium cations shown by the following general formulas (b1-M-1) and (b1-M-2), and the like.

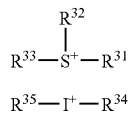

wherein $R^{31}$, $R^{32}$, and $R^{33}$ represent a substituted or unsubstituted linear or branched alkyl group having 1 to 10 carbon atoms or a substituted or unsubstituted aryl group having 6 to 18 carbon atoms, or two of $R^{31}$, $R^{32}$, and $R^{33}$ bond to form a cyclic structure together with the sulfur atom, and one of $R^{31}$, $R^{32}$, and $R^{33}$ other than the two of $R^{31}$, $R^{32}$, and $R^{33}$ represents a substituted or unsubstituted linear or branched alkyl group having 1 to 10 carbon atoms or a substituted or unsubstituted aryl group having 6 to 18 carbon atoms.

In the general formula (M-2), $R^{34}$ and $R^{35}$ represent a substituted or unsubstituted linear or branched alkyl group having 1 to 10 carbon atoms or a substituted or unsubstituted aryl group having 6 to 18 carbon atoms, or bond to form a cyclic structure together with the iodine atom.

Examples of the unsubstituted linear or branched alkyl group having 1 to 10 carbon atoms include a methyl group, an ethyl group, an n-propyl group, an i-propyl group, an n-butyl group, a 2-methylpropyl group, a 1-methylpropyl group, a t-butyl group, and the like.

The alkyl group may be substituted with a halogen atom (e.g., fluorine atom, chlorine atom, bromine atom, or iodine atom), a hydroxyl group, a thiol group, an organic group that includes a heteroatom (e.g., halogen atom, oxygen atom, nitrogen atom, sulfur atom, phosphorus atom, or silicon atom), or the like.

Examples of the unsubstituted aryl group having 6 to 18 carbon atoms include a phenyl group, a naphthyl group, and the like.

The aryl group may be substituted with a halogen atom (e.g., fluorine atom, chlorine atom, bromine atom, or iodine atom), a hydroxyl group, a thiol group, an alkyl group, an organic group that includes a heteroatom (e.g., halogen atom, oxygen atom, nitrogen atom, sulfur atom, phosphorus atom, or silicon atom), or the like.

The monovalent onium cation site represented by $M^+$ in the general formula (b1) may be produced by the method disclosed in Advances in Polymer Science, Vol. 62, pp. 1-48 (1984), for example.

Examples of the monovalent anion represented by $Z^-$ in the general formula (b1) include anions shown by the following general formulas (b1-Z-1) to (b1-Z-4), and the like. Among these, the anion shown by the general formula (b1-Z-1) or (b1-Z-2) is preferable.

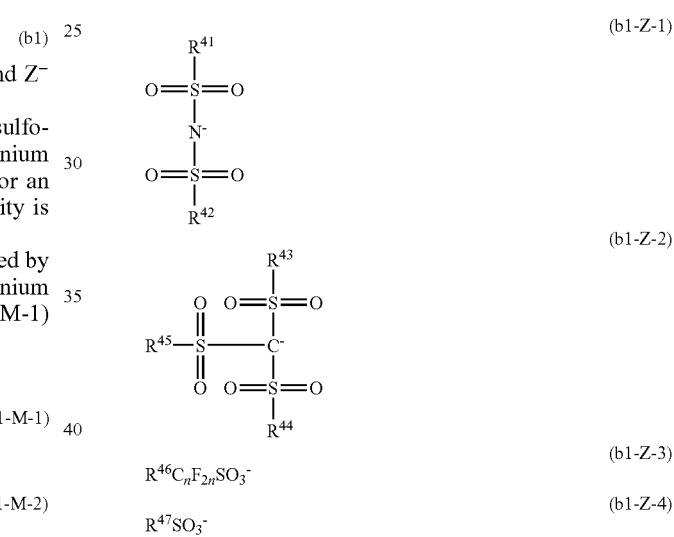

In the general formula (b1-Z-1), $R^{41}$ and $R^{42}$ represent a fluorine atom or an alkyl group having 1 to 20 carbon atoms that is substituted with at least one fluorine atom, or bond to form a cyclic structure having 1 to 20 carbon atoms that is substituted with at least one fluorine atom.

In the general formula (b1-Z-2), $R^{43}$, $R^{44}$, and $R^{45}$ represent an alkyl group having 1 to 20 carbon atoms that is substituted with at least one fluorine atom, or two of $R^{43}$, $R^{44}$, and $R^{45}$ bond to form a cyclic structure having 1 to 20 carbon atoms that is substituted with at least one fluorine atom, and one of $R^{43}$, $R^{44}$, and $R^{45}$ other than the two of $R^{43}$, $R^{44}$, and $R^{45}$ represents an alkyl group having 1 to 20 carbon atoms that is substituted with at least one fluorine atom.

In the general formulas (b1-Z-3) and (b1-Z-4), $R^{46}$ and $R^{47}$ represent a fluorine atom or a substituted or unsubstituted hydrocarbon group having 1 to 12 carbon atoms, and n is an integer from 1 to 10.

Examples of the alkyl group having 1 to 20 carbon atoms that is substituted with at least one fluorine atom include a methyl group, an ethyl group, an n-propyl group, an i-propyl group, an n-butyl group, a 2-methylpropyl group, a 1-methylpropyl group, a t-butyl group, and the like wherein at least one hydrogen atom is substituted with a fluorine atom.

Specific examples of the onium salts include triphenylsulfonium trifluoromethanesulfonate, triphenylsulfonium nonafluoro-n-butanesulfonate, triphenylsulfonium benzenesulfonate, triphenylsulfonium 10-camphorsulfonate, triphenylsulfonium n-octanesulfonate, triphenylsulfonium 4-trifluoromethylbenzensulfonate, triphenylsulfonium naphthalenesulfonate, triphenylsulfonium perfluorobenzenesulfonate, triphenylsulfonium 1,1,2,2-tetrafluoro-2-(tetracyclo[4.4.0.1$^{2,5}$.1$^{7,10}$]dodecan-8-yl)ethanesulfonate, triphenylsulfonium 1,1-difluoro-2-(bicyclo[2.2.1]heptan-2-yl)ethanesulfonate; (4-t-butoxyphenyl)diphenylsulfonium trifluoromethanesulfonate, (4-t-butoxyphenyl)diphenylsulfonium nonafluoro-n-butanesulfonate, (4-t-butoxyphenyl)diphenylsulfonium nonafluoro-n-octanesulfonate, (4-t-butoxyphenyl)diphenylsulfonium 10-camphorsulfonate, (4-hydroxyphenyl)diphenylsulfonium trifluoromethanesulfonate, (4-hydroxyphenyl)diphenylsulfonium nonafluoro-n-butanesulfonate, (4-hydroxyphenyl)diphenylsulfonium perfluoro-n-octanesulfonate, (4-hydroxyphenyl)diphenylsulfonium 10-camphorsulfonate, (4-hydroxyphenyl)diphenylsulfonium n-octanesulfonate, tris(4-methoxyphenyl)sulfonium trifluoromethanesulfonate, tris(4-methoxyphenyl)sulfonium nonafluoro-n-butanesulfonate, tris(4-methoxyphenyl)sulfonium nonafluoro-n-octanesulfonate, tris(4-methoxyphenyl)sulfonium 10-camphorsulfonate, (4-fluorophenyl)diphenylsulfonium trifluoromethanesulfonate, (4-fluorophenyl)diphenylsulfonium nonafluoro-n-butanesulfonate, (4-fluorophenyl)diphenylsulfonium 10-camphorsulfonate; tris(4-fluorophenyl)sulfonium trifluoromethanesulfonate, tris(4-fluorophenyl)sulfonium nonafluoro-n-butanesulfonate, tris(4-fluorophenyl)sulfonium 10-camphorsulfonate, tris(4-fluorophenyl)sulfonium p-toluenesulfonate, tris(4-trifluoromethylphenyl)sulfonium trifluoromethanesulfonate, 2,4,6-trimethylphenyldiphenylsulfonium trifluoromethanesulfonate, 2,4,6-trimethylphenyldiphenylsulfonium 2,4-difluorobenzenesulfonate, 2,4,6-trimethylphenyldiphenylsulfonium 4-trifluoromethylbenzensulfonate; diphenyliodonium trifluoromethanesulfonate, diphenyliodonium nonafluoro-n-butanesulfonate, diphenyliodonium perfluoro-n-octanesulfonate, diphenyliodonium 10-camphorsulfonate, diphenyliodonium n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 10-camphorsulfonate, bis(4-t-butylphenyl)iodonium n-octanesulfonate, (4-methoxyphenyl)phenyliodonium trifluoromethanesulfonate, (4-methoxyphenyl)phenyliodonium nonafluoro-n-butanesulfonate, (4-methoxyphenyl)phenyliodonium perfluoro-n-octanesulfonate, (4-fluorophenyl)phenyliodonium trifluoromethanesulfonate, (4-fluorophenyl)phenyliodonium nonafluoro-n-butanesulfonate, (4-fluorophenyl)phenyliodonium 10-camphorsulfonate; bis(4-fluorophenyl)iodonium trifluoromethanesulfonate, bis(4-fluorophenyl)iodonium nonafluoro-n-butanesulfonate, bis(4-fluorophenyl)iodonium 10-camphorsulfonate, bis(4-chlorophenyl)iodonium trifluoromethanesulfonate, bis(4-chlorophenyl)iodonium nonafluoro-n-butanesulfonate, bis(4-chlorophenyl)iodonium perfluoro-n-octanesulfonate, bis(4-chlorophenyl)iodonium-n-dodecylbenzenesulfonate, bis(4-chlorophenyl)iodonium 10-camphorsulfonate, bis(4-chlorophenyl)iodonium n-octanesulfonate, bis(4-chlorophenyl)iodonium 4-trifluoromethylbenzensulfonate, bis(4-chlorophenyl)iodonium perfluorobenzenesulfonate, bis(4-trifluoromethylphenyl)iodonium trifluoromethanesulfonate, bis(4-trifluoromethylphenyl)iodonium nonafluoro-n-butanesulfonate, bis(4-trifluoromethylphenyl)iodonium perfluoro-n-octanesulfonate, bis(4-trifluoromethylphenyl)iodonium n-dodecylbenzenesulfonate, bis(4-trifluoromethylphenyl)iodonium p-toluenesulfonate, bis(4-trifluoromethylphenyl)iodonium benzenesulfonate, bis(4-trifluoromethylphenyl)iodonium 10-camphorsulfonate, bis(4-trifluoromethylphenyl)iodonium n-octanesulfonate, bis(4-trifluoromethylphenyl)iodonium 4-trifluoromethylbenzensulfonate, bis(4-trifluoromethylphenyl)iodonium perfluorobenzenesulfonate; compounds shown by the following formulas (2x-1) to (2x-43); and the like.

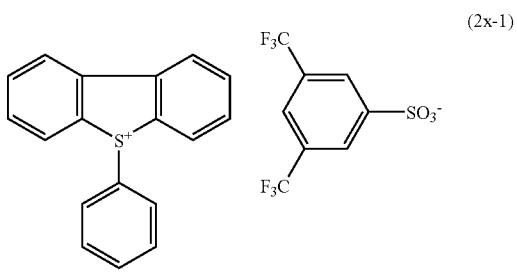

(2x-1)

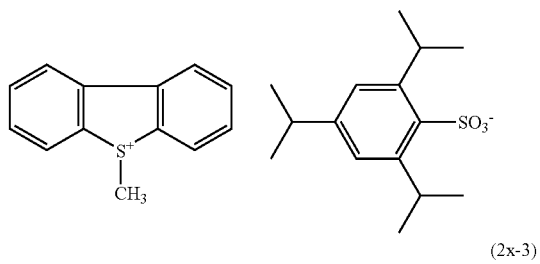

(2x-2)

(2x-3)

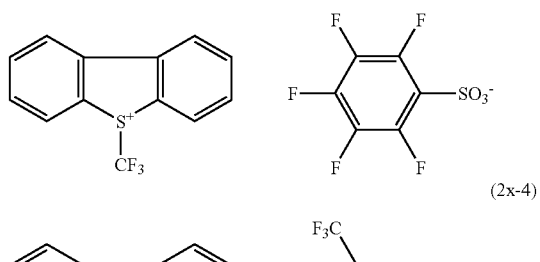

(2x-4)

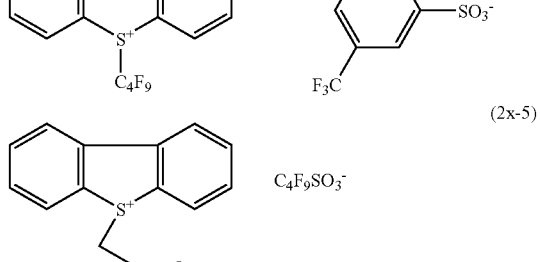

(2x-5)

(2x-6)

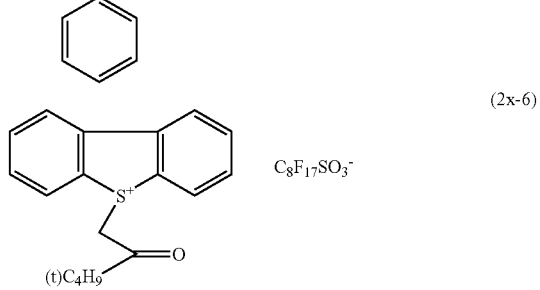

-continued
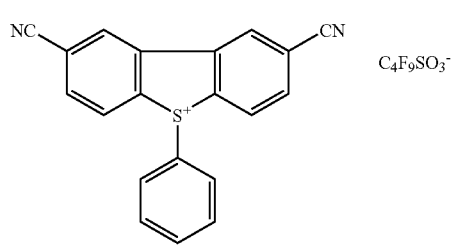 (2x-7) C₄F₉SO₃⁻
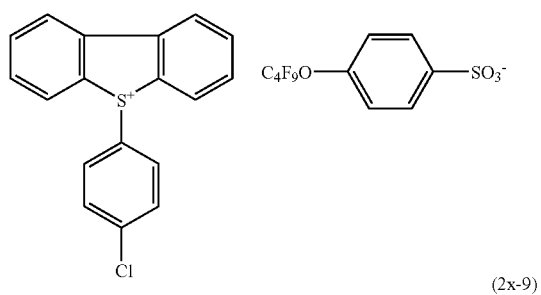 (2x-8) C₄F₉O-⟨⟩-SO₃⁻
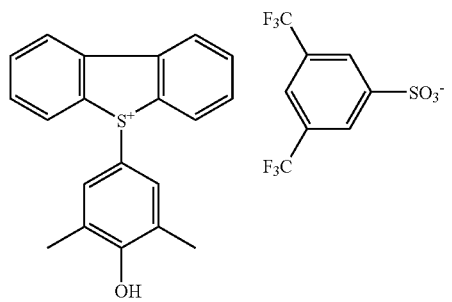 (2x-9) <image structure> 3,5-(CF₃)₂C₆H₃SO₃⁻
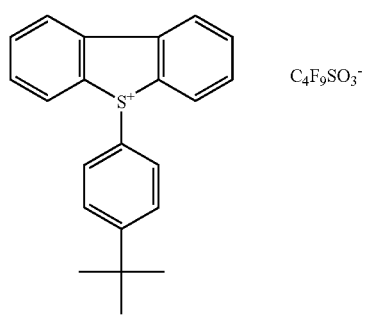 (2x-10) C₄F₉SO₃⁻
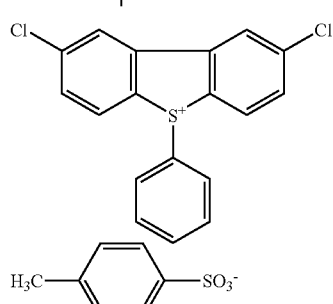 (2x-11) H₃C-⟨⟩-SO₃⁻
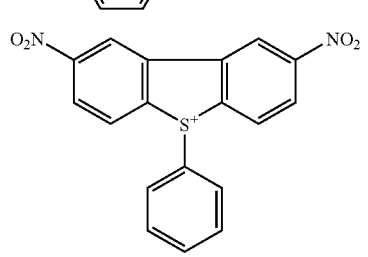 (2x-12)
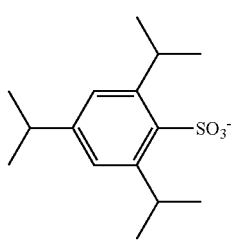 (2x-12 continued) ArSO₃⁻
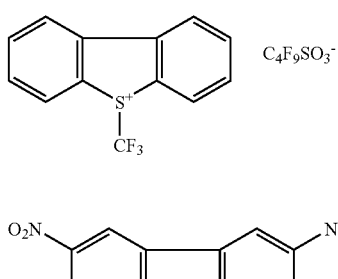 (2x-13) C₄F₉SO₃⁻
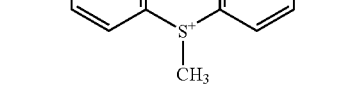 (2x-14) C₈F₁₇SO₃⁻
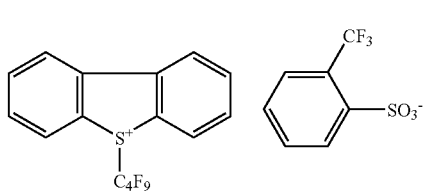 (2x-15) 2-CF₃C₆H₄SO₃⁻
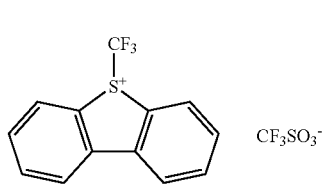 (2x-16) CF₃SO₃⁻
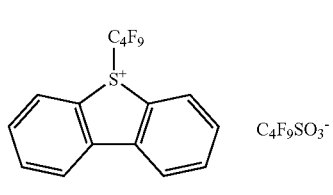 (2x-17) C₄F₉SO₃⁻
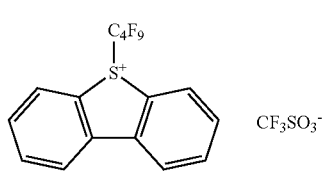 (2x-18) CF₃SO₃⁻
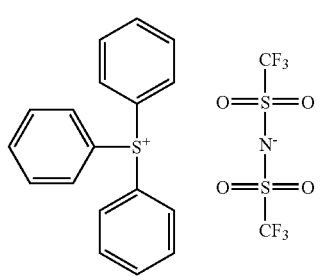 (2x-19)

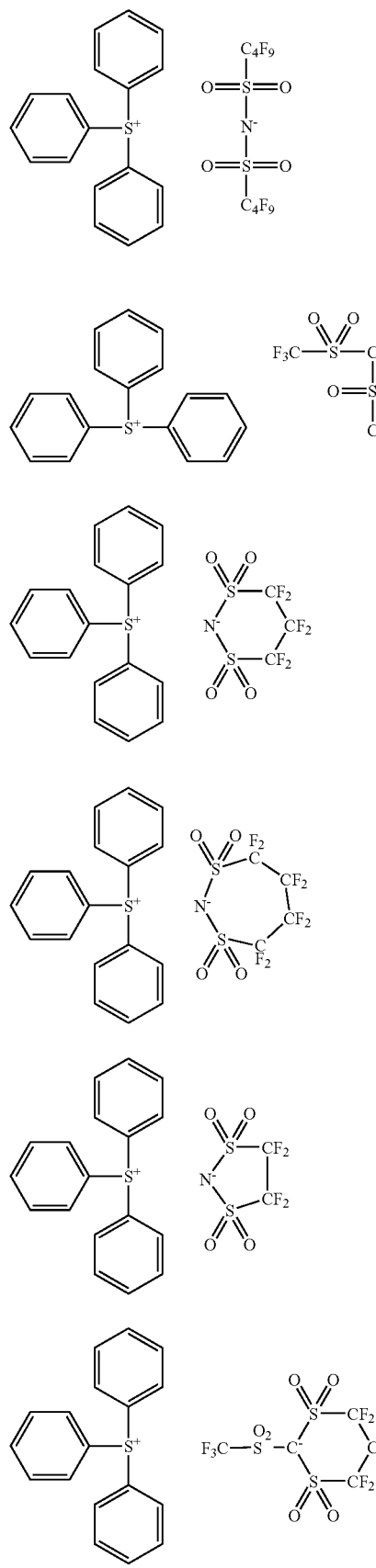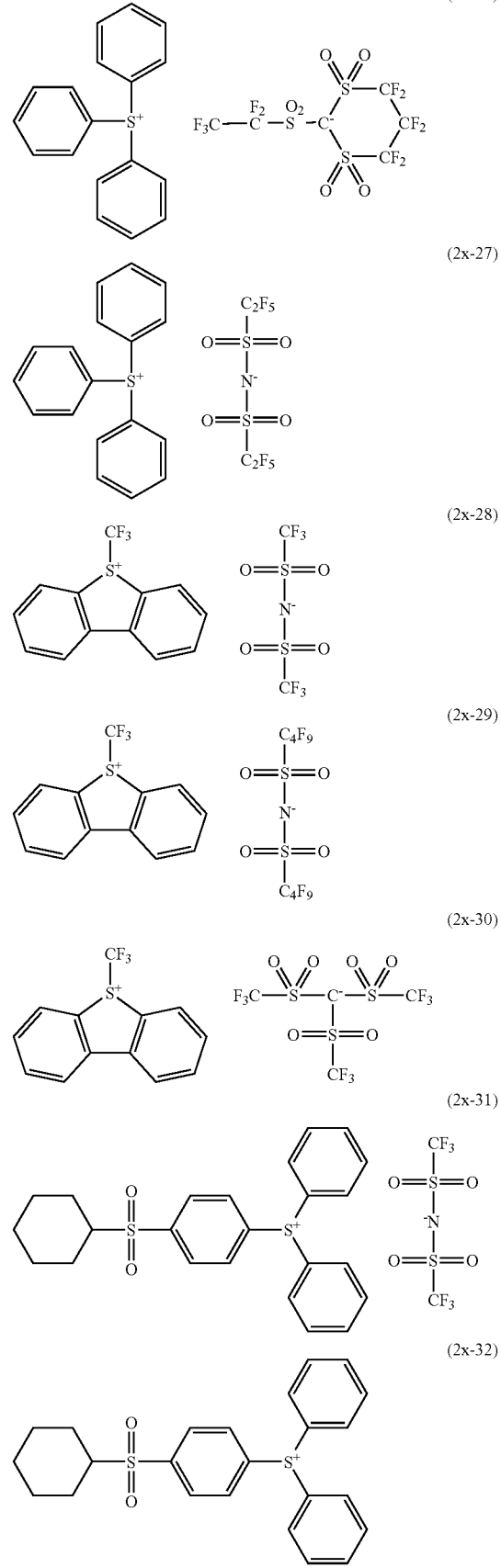

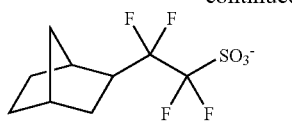
(2x-33)
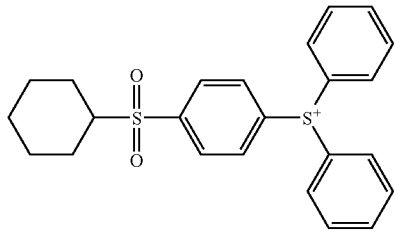
(2x-34)
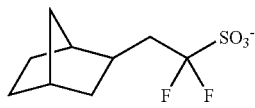
$F_3C-SO_3^-$
(2x-35)
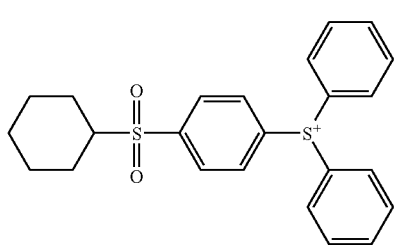
$^-O_3S-C_4F_9$
(2x-36)
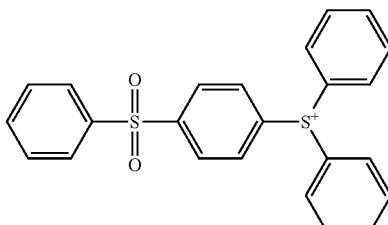
(2x-37)
(2x-38)
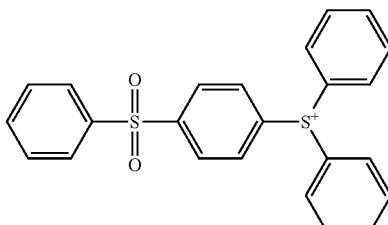
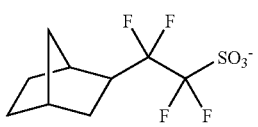
(2x-39)
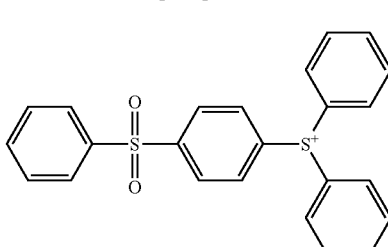
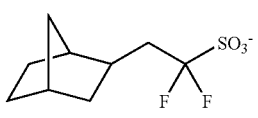
(2x-40)
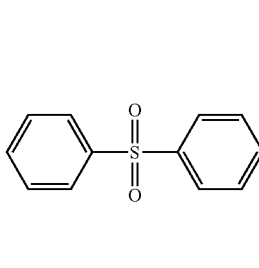
$F_3C-SO_3^-$
(2x-41)
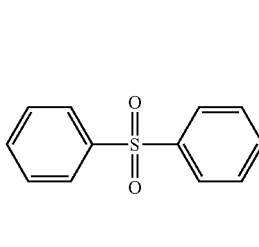
$^-O_3S-C_4F_9$
(2x-42)
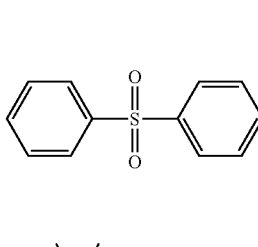

(2x-43)

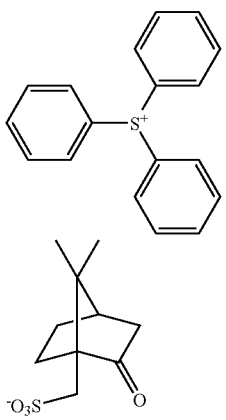

Among these, triphenylsulfonium trifluoromethanesulfonate, triphenylsulfonium nonafluoro-n-butanesulfonate, triphenylsulfonium 10-camphorsulfonate, (4-hydroxyphenyl)diphenylsulfonium trifluoromethanesulfonate, (4-hydroxyphenyl)diphenylsulfonium nonafluoro-n-butanesulfonate, tris(4-methoxyphenyl)sulfonium trifluoromethanesulfonate, tris(4-methoxyphenyl)sulfonium nonafluoro-n-butanesulfonate, (4-fluorophenyl)diphenylsulfonium trifluoromethanesulfonate, (4-fluorophenyl)diphenylsulfonium nonafluoro-n-butanesulfonate, 2,4,6-trimethylphenyldiphenylsulfonium trifluoromethanesulfonate, 2,4,6-trimethylphenyldiphenylsulfonium 2,4-difluorobenzenesulfonate, 2,4,6-trimethylphenyldiphenylsulfonium 4-trifluoromethylbenzensulfonate, diphenyliodonium trifluoromethanesulfonate, diphenyliodonium nonafluoro-n-butanesulfonate, diphenyliodonium 10-camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium 10-camphorsulfonate, (4-fluorophenyl)phenyliodonium trifluoromethanesulfonate, (4-fluorophenyl)phenyliodonium nonafluoro-n-butanesulfonate, (4-fluorophenyl)phenyliodonium 10-camphorsulfonate, bis(4-fluorophenyl)iodonium trifluoromethanesulfonate, bis(4-fluorophenyl)iodonium nonafluoro-n-butanesulfonate, bis(4-fluorophenyl)iodonium 10-camphorsulfonate, and tris(4-trifluoromethylphenyl)sulfonium trifluoromethanesulfonate, triphenylsulfonium 1,1,2,2-tetrafluoro-2-(tetracyclo[4.4.0.1$^{2.5}$.1$^{7.10}$]dodecan-8-yl)ethanesulfonate, triphenylsulfonium 1,1-difluoro-2-(bicyclo[2.2.1]heptan-2-yl)ethanesulfonate, and the compounds shown by the formulas (2x-13), (2x-16), (2x-17), (2x-18), (2x-19), (2x-20), (2x-27), (2x-28), (2x-29), (2x-31), (2x-36), and (2x-43) are preferable.

Examples of the diazomethane compounds include bis(trifluoromethanesulfonyl)diazomethane, bis(cyclohexylsulfonyl)diazomethane, bis(3,3-dimethyl-1,5-dioxaspiro[5.5]dodecane-8-sulfonyl)diazomethane, bis(1,4-dioxaspiro[4.5]decane-7-sulfonyl)diazomethane, bis(t-butylsulfonyl)diazomethane, and the like.

Among these, bis(cyclohexylsulfonyl)diazomethane, bis(3,3-dimethyl-1,5-dioxaspiro[5.5]dodecane-8-sulfonyl)diazomethane, and bis(1,4-dioxaspiro[4.5]decane-7-sulfonyl)diazomethane are preferable.

Examples of the sulfonimide compounds include N-(trifluoromethylsulfonyloxy)bicyclo[2.2.1]hept-5-ene-2,3-dicarboxylmide, N-(trifluoromethylsulfonyloxy)-7-oxabicyclo[2.2.1]hept-5-ene-2,3-dicarboxylmide, N-(trifluoromethylsulfonyloxy)bicyclo[2.2.1]heptan-5,6-oxy-2,3-dicarboxylmide; N-(10-camphorsulfonyloxy)succinimide, N-(10-camphorsulfonyloxy)phthalimide, N-(10-camphorsulfonyloxy)-7-oxabicyclo[2.2.1]hept-5-ene-2,3-dicarboxylmide, N-(10-camphorsulfonyloxy)bicyclo[2.2.1]heptan-5,6-oxy-2,3-dicarboxylmide, N-(10-camphorsulfonyloxy)naphthylimide, N-[(5-methyl-5-carboxymethylbicyclo[2.2.1]heptan-2-yl)sulfonyloxy]succinimide, N-(n-octylsulfonyloxy)bicyclo[2.2.1]hept-5-ene-2,3-dicarboxylmide, N-(n-octylsulfonyloxy)bicyclo[2.2.1]heptane-5,6-oxy-2,3-dicarboxylmide, N-(perfluorophenylsulfonyloxy)bicyclo[2.2.1]hept-5-ene-2,3-dicarboxylmide, N-(perfluorophenylsulfonyloxy)-7-oxabicyclo[2.2.1]hept-5-ene-2,3-dicarboxylmide, N-(perfluorophenylsulfonyloxy)bicyclo[2.2.1]heptan-5,6-oxy-2,3-dicarboxylmide, N-(nonafluoro-n-butylsulfonyloxy)bicyclo[2.2.1]hept-5-ene-2,3-dicarboxylmide, N-(nonafluoro-n-butylsulfonyloxy)-7-oxabicyclo[2.2.1]hept-5-ene-2,3-dicarboxylmide, N-(nonafluoro-n-butylsulfonyloxy)bicyclo[2.2.1]heptan-5,6-oxy-2,3-dicarboxylmide, N-(perfluoro-n-octylsulfonyloxy)bicyclo[2.2.1]hept-5-ene-2,3-dicarboxylmide, N-(perfluoro-n-octylsulfonyloxy)-7-oxabicyclo[2.2.1]hept-5-ene-2,3-dicarboxylmide, N-(perfluoro-n-octylsulfonyloxy)bicyclo[2.2.1]heptan-5,6-oxy-2,3-dicarboxylmide, and the like.

Among these, N-(trifluoromethylsulfonyloxy)bicyclo[2.2.1]hept-5-ene-2,3-dicarboxylmide, N-(10-camphorsulfonyloxy)succinimide, and N-[(5-methyl-5-carboxymethylbicyclo[2.2.1]heptan-2-yl)sulfonyloxy]succinimide are preferable.

The acid generator (B) is preferably used in an amount of 0.1 to 50 parts by mass, and more preferably 0.5 to 50 parts by mass, based on 100 parts by mass of the polymer (A). If the amount of the acid generator (B) is less than 0.1 parts by mass, the sensitivity and the developability of the radiation-sensitive composition may decrease. If the amount of the acid generator (B) exceeds 50 parts by mass, the transparency to radiation, the pattern shape, the heat resistance, etc. of the radiation-sensitive composition may decrease.

2-3. Acid Diffusion Controller

The radiation-sensitive composition according to one embodiment of the present invention preferably further includes an acid diffusion controller (hereinafter may be referred to as "acid diffusion controller (C)") in addition to the polymer (A) and the acid generator (B).

The acid diffusion controller (C) controls a phenomenon wherein an acid generated by the acid generator (B) upon exposure is diffused in the resist film, and suppresses undesired chemical reactions in the unexposed area.

The acid diffusion controller (C) improves the storage stability of the resulting radiation-sensitive composition, and sufficiently improves the resolution of the resulting resist film. Moreover, the acid diffusion controller (C) suppresses a change in line width of the resist pattern due to a change in post-exposure delay (PED) from exposure, so that a radiation-sensitive composition that exhibits remarkably superior process stability can be obtained.

A nitrogen-containing organic compound or a photosensitive basic compound is preferably used as the acid diffusion controller (C).

Examples of the nitrogen-containing organic compound include a compound shown by the following general formula (7) (hereinafter may be referred to as "nitrogen-containing compound (i)"), a compound that includes two nitrogen atoms in the molecule (hereinafter may be referred to as "nitrogen-containing compound (ii)"), a polyamino compound or a polymer that includes three or more nitrogen atoms (hereinafter may be collectively referred to as "nitrogen-containing compound (iii)"), an amide group-containing compound, a urea compound, a nitrogen-containing heterocyclic compound, and the like.

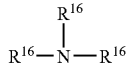
(7)

wherein $R^{16}$ represent a hydrogen atom, a substituted or unsubstituted linear, branched or cyclic alkyl group, a substituted or unsubstituted aryl group, or a substituted or unsubstituted aralkyl group.

Preferable examples of the nitrogen-containing compound (i) include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo) alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; and substituted alkylamines such as triethanolamine; aromatic amines such as aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-tert-butyl-N-methylaniline, N-phenyldiethanolamine, and 2,6-diisopropylaniline; and the like.

Preferable examples of the nitrogen-containing compound (ii) include ethylenediamine, N,N,N',N'-tetramethylethylenediamine, tetramethylenediamine, hexamethylenediamine, 4,4'-diaminodiphenylmethane, 4,4'-diamino diphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis (2-diethylaminoethyl)ether,1-(2-hydroxyethyl)-2-imidazolizinone, 2-quinoxalinol, N,N,N',N'-tetrakis(2-hydroxypropyl)ethylenediamine, N,N,N',N'',N''-pentamethyldiethylenetriamine, and the like.

Preferable examples of the nitrogen-containing compound (iii) include polyethyleneimine, polyallylamine, poly(2-dimethylaminoethylacrylamide), and the like.

Preferable examples of the amide group-containing compound include N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(–)-1-(t-butoxycarbonyl)-2-pyrrolidine methanol, (R)-(+)-1-(t-butoxycarbonyl)-2-pyrrolidine methanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N'-di-t-butoxycarbonyl-N-methyl-1-adamantylamine, N-t-butoxycarbonyl-4,4'-diaminodiphenylmethane, N,N-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl)isocyanuric acid; and the like.

Preferable examples of the urea compound include urea, methylurea, 1,1-dimethylurea, 1,3-dimethylurea, 1,1,3,3-tetramethylurea, 1,3-diphenylurea, tri-n-butylthiourea, and the like.

Preferable examples of the nitrogen-containing heterocyclic compound include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine, and 2,2':6',2''-terpyridine; piperazines such as piperazine and 1-(2-hydroxyethyl)piperazine; pyrazine, pyrazole, pyridazine, quinoxaline, purine, pyrrolidine, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane; and the like.

The photosensitive basic compound is decomposed and loses basicity in the exposed area, and remains without being decomposed in the unexposed area. The photosensitive basic compound can effectively utilize an acid generated in the exposed area, and can thus improve sensitivity as compared with a non-photosensitive basic compound.

The type of photosensitive basic compound is not particularly limited insofar the photosensitive basic compound has the above properties. Specific examples of the photosensitive basic compound include compounds shown by the following general formulas (8-1) and (8-2), and the like.

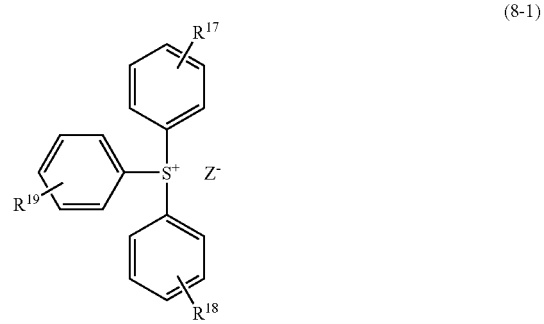
(8-1)

(8-2)

wherein $R^{17}$ to $R^{21}$ represent a hydrogen atom, a halogen atom, a substituted or unsubstituted alkyl group having 1 to 10 carbon atoms, or a substituted or unsubstituted alicyclic hydrocarbon group, an —OSO$_2$—R$^c$ group, or an —SO$_2$—R$^d$ group (wherein R$^c$ and R$_d$ represent a substituted or unsubstituted alkyl group having 1 to 10 carbon atoms, a substituted or unsubstituted alicyclic hydrocarbon group, or a substituted or unsubstituted aryl group), and Z$^-$ represents OH$^-$, R$^{22}$O$^-$, or R$^{22}$COO$^-$ (wherein R$^{22}$ represents a monovalent organic group).

Examples of the substituted or unsubstituted alkyl group having 1 to 10 carbon atoms represented by R$^{17}$ to R$^{21}$ in the general formulas (8-1) and (8-2) include a methyl group, an ethyl group, an n-butyl group, a t-butyl group, a trifluoromethyl group, and the like. Note that the alkyl group may be substituted with a hydroxyl group, a carboxyl group, a halogen atom (e.g., fluorine atom or bromine atom), an alkoxy group (e.g., methoxy group, ethoxy group, propoxy group, butoxy group, or t-butoxy group), an alkyloxycarbonyl group (e.g., t-butoxycarbonylmethyloxy group), or the like.

Examples of the substituted or unsubstituted alicyclic hydrocarbon group represented by R$^{17}$ to R$^{21}$ include the structures shown by the general formulas (a-1) to (a-50), and the like. Note that the alicyclic hydrocarbon group may be substituted with a hydroxyl group, a carboxyl group, a halogen atom (e.g., fluorine atom or bromine atom), an alkoxy group (e.g., methoxy group, ethoxy group, propoxy group, butoxy group, or t-butoxy group), an alkyloxycarbonyl group (e.g., t-butoxycarbonylmethyloxy group), or the like.

Examples of the halogen atom represented by R$^{17}$ to R$^{21}$ include a fluorine atom, a chlorine atom, a bromine atom, and an iodine atom.

Examples of the substituted or unsubstituted alkyl group having 1 to 10 carbon atoms represented by R$^c$ and R$^d$ of the —OSO$_2$—R$^c$ group and the —SO$_2$—R$^d$ group represented by R$^{17}$ to R$^{21}$ include a methyl group, an ethyl group, an n-butyl group, a t-butyl group, a trifluoromethyl group, and the like. Note that the alkyl group may be substituted with a hydroxyl group, a carboxyl group, a halogen atom (e.g., fluorine atom or bromine atom), an alkoxy group (e.g., methoxy group, ethoxy group, propoxy group, butoxy group, or t-butoxy group), an alkyloxycarbonyl group (e.g., t-butoxycarbonylmethyloxy group), or the like.

Examples of the substituted or unsubstituted alicyclic hydrocarbon group represented by R$^c$ and R$^d$ include the structures shown by the general formulas (a-1) to (a-50), and the like. Note that the alicyclic hydrocarbon group may be substituted with a hydroxyl group, a carboxyl group, a halogen atom (e.g., fluorine atom or bromine atom), an alkoxy group (e.g., methoxy group, ethoxy group, propoxy group, butoxy group, or t-butoxy group), an alkyloxycarbonyl group (e.g., t-butoxycarbonylmethyloxy group), or the like.

Examples of the substituted or unsubstituted aryl group represented by R$^c$ and R$^d$ include the structures shown by the general formulas (x-1) to (x-3), and the like. Note that the aryl group may be substituted with a hydroxyl group, a carboxyl group, a halogen atom (e.g., fluorine atom or bromine atom), an alkoxy group (e.g., methoxy group, ethoxy group, propoxy group, butoxy group, or t-butoxy group), an alkyloxycarbonyl group (e.g., t-butoxycarbonylmethyloxy group), or the like.

R$^c$ and R$^d$ preferably represent a cyclohexyl group, a phenyl group, a methyl group, or a trifluoromethyl group.

R$^{17}$ to R$^{21}$ preferably represent a hydrogen atom or a t-butyl group. R$^{17}$ to R$^{19}$ in the general formula (8-1) may be either the same or different. R$^{20}$ and R$^{21}$ in the general formula (8-2) may be either the same or different.

Z$^-$ in the general formulas (8-1) and (8-2) represents OH$^-$, R$^{22}$O$^-$, or R$^{22}$COO$^-$.

Examples of the monovalent organic group represented by R$^{22}$ include a substituted or unsubstituted alkyl group, a substituted or unsubstituted aryl group, and the like.

Z$^-$ preferably represents OH$^-$, CH$_3$COO$^-$, or any of compounds (Z-1) to (Z-5) shown by the following formulas.

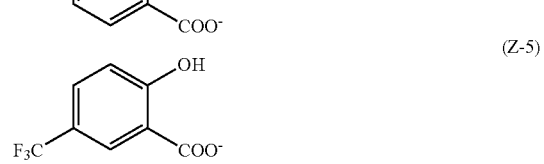

Specific examples of the photosensitive basic compound include a triphenylsulfonium compound (i.e., the compound shown by the general formula (8-1)) wherein the anion moiety (Z$^-$) is OH$^-$, CH$_3$COO$^-$, or the compound (Z-2) or (Z-3), and the like.

The acid diffusion controllers (C) may be used either individually or in combination.

The acid diffusion controller (C) is preferably used in an amount of 30 parts by mass or less, more preferably 0.001 to 30 parts by mass, and still more preferably 0.005 to 15 parts by mass, based on 100 parts by mass of the polymer (A). If the amount of the acid diffusion controller (C) exceeds 15 parts by mass, the sensitivity of the resulting resist film or the developability of the exposed area may decrease. If the amount of the acid diffusion controller (C) is less than 0.001 parts by mass, the pattern shape or the dimensional accuracy of the resulting resist film may decrease depending on the process conditions.

2-4. Other Components

The radiation-sensitive composition according to one embodiment of the invention is preferably prepared by dissolving the polymer (A), the acid generator (B), and the acid diffusion controller (C) in a solvent. Specifically, the radiation-sensitive composition preferably further includes a solvent.

Additives such as a surfactant, a sensitizer, and an aliphatic additive may optionally be added to the radiation-sensitive composition.

The solvent is preferably at least one compound linear or branched ketones, cyclic ketones, propylene glycol monoalkyl ether acetates, alkyl 2-hydroxypropionates, alkyl 3-alkoxypropionates, and γ-butyrolactone.

The solvent is preferably used so that the total solid content of the radiation-sensitive composition is 1 to 70 mass %, more preferably 1 to 15 mass %, and still more preferably 1 to 10 mass %.

The radiation-sensitive composition may be prepared by homogeneously dissolving the polymer (A), the acid generator (B), the acid diffusion controller (C), and other optional components (excluding the solvent) in the solvent so that the total solid content is within the above range. The radiation-sensitive composition thus prepared is preferably filtered through a filter having a pore size of about 0.2 μm, for example.

The surfactant improves the applicability, striation, developability, etc., of the radiation-sensitive composition.

Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate, commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like. These surfactants may be used either individually or in combination.

The surfactant is preferably used in an amount of 0.001 to 2 parts by mass based on 100 parts by mass of the polymer (A).

The sensitizer absorbs the energy of radiation, and transmits the energy to the acid generator (B) so that the amount of acid generated increases. Specifically, the sensitizer improves the apparent sensitivity of the radiation-sensitive composition.

Examples of the sensitizer include carbazoles, acetophenones, benzophenones, naphthalenes, phenols, biacetyl, eosine, rose bengal, pyrenes, anthracenes, phenothiazines, and the like. These sensitizers may be used either individually or in combination.

The sensitizer is preferably used in an amount of 0.1 to 10 parts by mass based on 100 parts by mass of the polymer (A).

A dye or a pigment visualizes the latent image in the exposed area, and reduces the effects of halation during exposure. An adhesion improver improves the adhesion of the resist film to a substrate.

The alicyclic additive further improves the dry etching resistance, the pattern shape, the adhesion to a substrate, and the like.

Examples of the alicyclic additive include adamantane derivatives such as 1-adamantanecarboxylic acid, 2-adamantanone, t-butyl 1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; 3-[2-hydroxy-2,2-bis(trifluoromethyl)ethyl]tetracyclo[4.4.0.1$^{2,5}$.1$^{7,10}$]dodecane; and the like. These alicyclic additives may be used either individually or in combination.

The alicyclic additive is preferably used in an amount of 0.5 to 20 parts by mass based on 100 parts by mass of the polymer (A). If the amount of the alicyclic additive exceeds 20 parts by mass, the heat resistance of the resulting resist film may decrease.

Examples of further additives include an alkali-soluble resin, a low-molecular-weight alkali solubility controller that include an acid-dissociable protecting group, a halation inhibitor, a preservative, an antifoaming agent, and the like.

3. Formation of Resist Pattern

The radiation-sensitive composition according to one embodiment of the invention is useful as a material for forming a chemically-amplified positive-tone resist film.

The chemically-amplified positive-tone resist film is designed so that the acid-dissociable group included in the polymer dissociates due to an acid generated by the acid generator upon exposure so that the polymer becomes alkali-soluble. Specifically, an alkali-soluble area occurs in the resist film. The alkali-soluble area corresponds to the exposed area of the resist. The exposed area can be dissolved and removed using an alkaline developer. A positive-tone resist pattern having a desired shape can thus be formed. The resist pattern-forming process is described in detail below.

When forming a resist pattern using the radiation-sensitive composition according to one embodiment of the invention, a resist film is formed using the radiation-sensitive composition. The radiation-sensitive composition may have been filtered through a filter having a pore size of about 0.2 μm after adjusting the total solid content, for example. The radiation-sensitive composition is applied to a substrate (e.g., silicon wafer or aluminum-coated wafer) using an appropriate application method (e.g., rotational coating, cast coating, or roll coating) to form a resist film. The resist film may optionally be pre-baked (PB) at about 70 to 160° C. The resist film is then exposed to form a desired resist pattern.

Examples of radiation that may be used for exposure include (extreme) deep ultraviolet rays such as KrF excimer laser light (wavelength: 248 nm), ArF excimer laser light (wavelength: 193 nm), EUV (extreme ultraviolet rays, wavelength: 13.5 nm), X-rays such as synchrotron radiation, charged particle rays such as electron beams, and the like.

The exposure conditions (e.g., dose) may be appropriately determined depending on the composition of the radiation-sensitive composition, the type of additive, and the like. Note that liquid immersion lithography may also be used.

The resist film is preferably subjected to post-exposure bake (PEB) after exposure. PEB ensures smooth dissociation of the acid-dissociable group included in the polymer. The PEB conditions may be appropriately selected depending on the composition of the radiation-sensitive composition. The PEB temperature is preferably 30 to 200° C., and more preferably 50 to 170° C.

In order to bring out the potential of the radiation-sensitive composition to a maximum extent, an organic or inorganic anti-reflective film may be formed on the substrate, as disclosed in Japanese Examined Patent Publication (KOKOKU) No. 6-12452 (Japanese Patent Application Publication (KOKAI) No. 59-93448), for example. A protective film may be formed on the resist film so that the resist film is not affected by basic impurities, etc., contained in the environmental atmosphere, as disclosed in Japanese Patent Application Publication (KOKAI) No. 5-188598, for example. Note that these methods may be used in combination.

The resist film thus exposed is developed to form a given resist pattern. The developer used for development is preferably an aqueous alkaline solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water.

The concentration of the aqueous alkaline solution is preferably 10 mass % or less. If the concentration of the aqueous alkaline solution exceeds 10 mass %, the unexposed area may also be dissolved in the developer.

The pH of the developer is preferably 8 to 14, and more preferably 9 to 14.

An organic solvent may be added to the alkaline aqueous solution (developer), for example. Examples of the organic solvent include ketones such as acetone, methyl ethyl ketone, methyl i-butyl ketone, cyclopentanone, cyclohexanone, 3-methylcyclopentanone, and 2,6-dimethylcyclohexanone; alcohols such as methanol, ethanol, n-propyl alcohol, i-propyl alcohol, n-butyl alcohol, t-butyl alcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like. These organic solvents may be used either individually or in combination.

The organic solvent is preferably used in an amount of 100 parts by volume or less based on 100 parts by volume of the alkaline aqueous solution. If the amount of the organic solvent exceeds 100 parts by volume, the exposed area may remain undeveloped due to a decrease in developability. An appropriate amount of surfactant or the like may also be added to the alkaline aqueous solution (developer).

After developing the resist film using the alkaline aqueous solution (developer), the resist film may be washed with water, and dried.

EXAMPLES

Several embodiments of the invention are further described below by way of examples. Note that the invention is not limited to the following examples. In the following examples, electron beams (EB) were used to expose the resist film. Note that similar basic resist properties are obtained when using short-wavelength radiation (e.g., EUV), and a correlation is observed between the basic resist properties obtained when using electron beams (EB) and the basic resist properties obtained when using short-wavelength radiation (e.g., EUV). In the following examples, the unit "parts" refers to "parts by mass" unless otherwise indicated.

1. Synthesis of Monomer

Example 1

15.9 g of 1-phenylcyclohexanol, 12.2 g of methacrylic chloride, and 13.12 g of 1,4-diazabicyclo[2.2.2]octane were dissolved in 200 g of methylene chloride, and reacted for 6 hours under reflux. After completion of the reaction, ethyl acetate was added to the reaction solution, and the organic layer was washed with water. The organic layer was then purified by silica gel column chromatography using an ethyl acetate/n-hexane mixture (1/4 (volume ratio)) as an eluant to obtain the target compound (yield: 60%).

The structure of the compound was determined by $^1$H-NMR ("JNM-ECA-400" manufactured by JEOL Ltd.). The following results were obtained. $^1$H-NMR (400 MHz, DMSO-d$_6$, internal standard: TMS): δ (ppm)=1.11-1.82 (8.0H), 1.85-1.90 (3.0H), 2.30-2.5 (2.0H), 5.58-6.10 (2.0H), 7.15-7.23 (1H), 7.23-7.35 (4.0H)

It was thus confirmed that the structure of the compound is shown by the following formula. This compound is referred to as a compound (M-1-1).

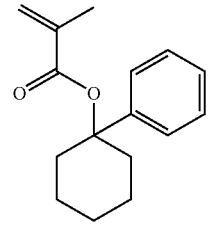

(M-1-1)

Example 2

17.29 g of 1-p-tolylcyclohexanol, 12.2 g of methacrylic chloride, and 13.12 g of 1,4-diazabicyclo[2.2.2]octane were dissolved in 200 g of methylene chloride, and reacted for 6 hours under reflux. After completion of the reaction, ethyl acetate was added to the reaction solution, and the organic layer was washed with water. The organic layer was then purified by silica gel column chromatography using an ethyl acetate/n-hexane mixture (1/4 (volume ratio)) as an eluant to obtain the target compound (yield: 62%).

The structure of the compound was determined in the same manner as in Example 1. The following results were obtained.

$^1$H-NMR (400 MHz, DMSO-d$_6$, internal standard: TMS): δ (ppm)=1.16-1.82 (8.0H), 1.82-1.95 (3.0H), 2.31-2.31 (3.0H), 2.19-2.45 (2.0H), 5.58-6.15 (2.0H), 7.01-7.30 (4H)

It was thus confirmed that the structure of the compound is shown by the following formula. This compound is referred to as a compound (M-1-2).

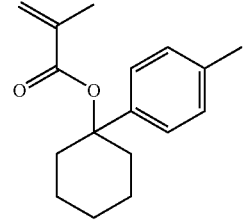

(M-1-2)

Example 3

20.4 g of 1-(naphthalen-1-yl)cyclohexanol, 12.2 g of methacrylic chloride, and 13.12 g of 1,4-diazabicyclo[2.2.2]octane were dissolved in 200 g of methylene chloride, and reacted for 6 hours under reflux. After completion of the reaction, ethyl acetate was added to the reaction solution, and the organic layer was washed with water. The organic layer was then purified by silica gel column chromatography using an ethyl acetate/n-hexane mixture (1/4 (volume ratio)) as an eluant to obtain the target compound (yield: 55%).

The structure of the compound was determined by $^1$H-NMR ("JNM-ECA-400" manufactured by JEOL Ltd.). The following results were obtained.

$^1$H-NMR (400 MHz, CDCl$_3$, internal standard: TMS): δ (ppm)=1.11-2.2 (11.0H), 2.90-3.20 (2.0H), 5.50-6.30 (2.0H), 7.30-7, 95 (6.0H), 8.43-8.65 (1.0H)

It was thus confirmed that the structure of the compound is shown by the following formula. This compound is referred to as a compound (M-1-3).

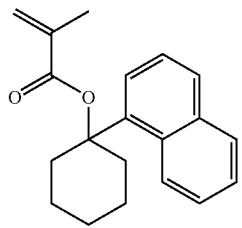

(M-1-3)

Example 4

15.9 g of 1-p-tolylcyclohexanol, 12.2 g of methacrylic chloride, and 13.12 g of 1,4-diazabicyclo[2.2.2]octane were dissolved in 200 g of methylene chloride, and reacted for 6 hours under reflux. After completion of the reaction, ethyl acetate was added to the reaction solution, and the organic layer was washed with water. The organic layer was then purified by silica gel column chromatography using an ethyl acetate/n-hexane mixture (1/4 (volume ratio)) as an eluant to obtain the target compound (yield: 54%).

The structure of the compound was determined by $^1$H-NMR ("JNM-ECA-400" manufactured by JEOL Ltd.). The following results were obtained.

$^1$H-NMR (400 MHz, DMSO-d$_6$, internal standard: TMS): δ (ppm)=1.52-1.90 (7.0H), 1.90-2.10 (2.0H), 2.15-2.26 (3.0H), 2.26-2.40 (2.0H), 5.50-6.10 (2.0H), 7.00-7.31 (4.0H)

It was thus confirmed that the structure of the compound is shown by the following formula. This compound is referred to as a compound (M-1-4).

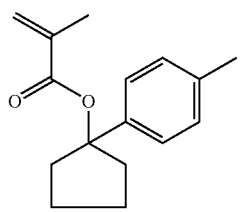

(M-1-4)

2. Synthesis of Polymer

Example 5

5.5 g of p-acetoxystyrene, 4.5 g of the compound (M-1-1) obtained by Example 1, 0.4 g of azobisisobutylonitrile (AIBN), and 0.1 g of t-dodecylmercaptan were dissolved in 10 g of propylene glycol monomethyl ether, and polymerized for 16 hours at 70° C. in a nitrogen atmosphere. After completion of polymerization, the reaction solution was added dropwise to 500 g of n-hexane to coagulate and purify the copolymer. After the addition of 7.59 g of propylene glycol monomethyl ether to the copolymer, 15 g of methanol, 4.0 g of triethylamine, and 1.0 g of water were added to the mixture. The mixture was hydrolyzed for 8 hours under reflux at the boiling point. After completion of the reaction, the solvent and triethylamine were evaporated under reduced pressure. After dissolving the resulting copolymer in 10 g of acetone, the solution was added dropwise to 100 g of water to coagulate the copolymer. A white powder thus produced was filtered, and dried overnight at 50° C. under reduced pressure.

The resulting copolymer had an Mw of 11,000 and an Mw/Mn ratio of 2.3. The molar ratio of the repeating units derived from p-hydroxystyrene and the repeating units derived from the compound (M-1-1) determined by $^{13}$C-NMR analysis was 65:35. This copolymer is referred to as a polymer (A-1).

Example 6

5.4 g of p-acetoxystyrene, 4.69 g of the compound (M-1-2) obtained by Example 2, 0.4 g of AIBN, and 0.1 g of t-dodecylmercaptan were dissolved in 10 g of propylene glycol monomethyl ether, and polymerized for 16 hours at 70° C. in a nitrogen atmosphere. After completion of polymerization, the reaction solution was added dropwise to 500 g of n-hexane to coagulate and purify the copolymer. After the addition of 7.5 g of propylene glycol monomethyl ether to the copolymer, 15 g of methanol, 4.0 g of triethylamine, and 1.0 g of water were added to the mixture. The mixture was hydrolyzed for 8 hours under reflux at the boiling point. After completion of the reaction, the solvent and triethylamine were evaporated under reduced pressure. After dissolving the resulting copolymer in 10 g of acetone, the solution was added dropwise to 100 g of water to coagulate the copolymer. A white powder thus produced was filtered, and dried overnight at 50° C. under reduced pressure.

The resulting copolymer had an Mw of 10,000 and an Mw/Mn ratio of 2.3. The molar ratio of the repeating units derived from p-hydroxystyrene and the repeating units derived from the compound (M-1-2) determined by $^{13}$C-NMR analysis was 64:36. This copolymer is referred to as a polymer (A-2).

Example 7

5.5 g of p-acetoxystyrene, 4.5 g of the compound (M-1-1) obtained by Example 1, and 1.0 g of AIBN were dissolved in 15 g of propylene glycol monomethyl ether, and polymerized for 16 hours at 70° C. in a nitrogen atmosphere. After completion of polymerization, the reaction solution was added dropwise to 500 g of n-hexane to coagulate and purify the copolymer. After the addition of 7.5 g of propylene glycol monomethyl ether to the copolymer, 15 g of methanol, 4.0 g of triethylamine, and 1.0 g of water were added to the mixture. The mixture was hydrolyzed for 8 hours under reflux at the boiling point. After completion of the reaction, the solvent and triethylamine were evaporated under reduced pressure. After dissolving the resulting copolymer in 10 g of acetone, the solution was added dropwise to 100 g of water to coagulate the copolymer. A white powder thus produced was filtered, and dried overnight at 50° C. under reduced pressure.

The resulting copolymer had an Mw of 4000 and an Mw/Mn ratio of 2.4. The molar ratio of the repeating units derived from p-hydroxystyrene and the repeating units derived from the compound (M-1-1) determined by $^{13}$C-NMR analysis was 65:35. This copolymer is referred to as a polymer (A-3).

Example 8

5.1 g of p-acetoxystyrene, 4.9 g of the compound (M-1-3) obtained by Example 3, 0.3 g of AIBN, and 0.1 g of t-dodecylmercaptan were dissolved in 10 g of propylene glycol monomethyl ether, and polymerized for 16 hours at 70° C. in a nitrogen atmosphere. After completion of polymerization, the reaction solution was added dropwise to 500 g of n-hexane to coagulate and purify the copolymer. After the addition of 7.5 g of propylene glycol monomethyl ether to the copolymer, 15 g of methanol, 4.0 g of triethylamine, and 1.0 g of water were added to the mixture. The mixture was hydrolyzed for 8 hours under reflux at the boiling point. After completion of the reaction, the solvent and triethylamine were evaporated under reduced pressure. After dissolving the resulting copolymer in 10 g of acetone, the solution was added dropwise to 100 g of water to coagulate the copolymer. A white powder thus produced was filtered, and dried overnight at 50° C. under reduced pressure.

The resulting copolymer had an Mw of 10,000 and an Mw/Mn ratio of 2.3. The molar ratio of the repeating units derived from p-hydroxystyrene and the repeating units derived from the compound (M-1-1) determined by $^{13}$C-NMR analysis was 65:35. This copolymer is referred to as a polymer (A-4).

Example 9

5.5 g of p-acetoxystyrene, 4.5 g of the compound (M-1-4) obtained by Example 4, 0.3 g of AIBN, and 0.1 g of t-dodecylmercaptan were dissolved in 10 g of propylene glycol monomethyl ether, and polymerized for 16 hours at 70° C. in a nitrogen atmosphere. After completion of polymerization, the reaction solution was added dropwise to 500 g of n-hexane to coagulate and purify the copolymer. After the addition of 7.5 g of propylene glycol monomethyl ether to the copolymer, 15 g of methanol, 4.0 g of triethylamine, and 1.0 g of water were added to the mixture. The mixture was hydrolyzed for 8 hours under reflux at the boiling point. After completion of the reaction, the solvent and triethylamine were evaporated under reduced pressure. After dissolving the resulting copolymer in 10 g of acetone, the solution was added dropwise to 100 g of water to coagulate the copolymer. A white powder thus produced was filtered, and dried overnight at 50° C. under reduced pressure. The resulting copolymer had an Mw of 11,000 and an Mw/Mn ratio of 2.3. The molar ratio of the repeating units derived from p-hydroxystyrene and the repeating units derived from the compound (M-1-4) determined by $^{13}$C-NMR analysis was 66:34. This copolymer is referred to as a polymer (A-5).

Example 10

4.8 g of a compound shown by the following formula (b-1), 5.2 g of the compound (M-1-1) obtained by Example 1, and 0.4 g of AIBN were dissolved in 30 g of methyl ethyl ketone, and polymerized for 6 hours at 78° C. in a nitrogen atmosphere. After completion of polymerization, the reaction solution was added dropwise to 500 g of methanol to coagulate and purify the copolymer. The resulting solid was dried at 50° C. overnight under reduced pressure.

The resulting copolymer had an Mw of 8000 and an Mw/Mn ratio of 2.1. The molar ratio of the repeating units derived from the compound shown by the formula (b-1) and the repeating units derived from the compound (M-1-1) determined by $^{13}$C-NMR analysis was 50:50. This copolymer is referred to as a polymer (A-6).

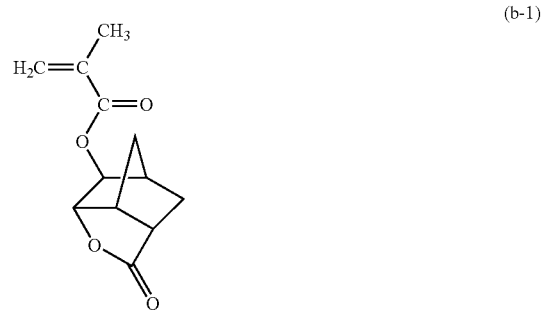

In the synthesis examples, the properties of each resin were measured and evaluated as follows.

(1) Mw and Mn

The Mw of each resin was measured by gel permeation chromatography (GPC) using GPC columns (manufactured by Tosoh Corp., G2000HXL×2, G3000HXL×1, G4000HXL×1) (flow rate: 1.0 ml/min, eluant: tetrahydrofuran, column temperature: 40° C., standard: monodisperse polystyrene). The dispersibility (Mw/Mn) was calculated from the measurement results.

(2) $^{13}$C-NMR Analysis

Each resin was subjected to $^{13}$C-NMR analysis using an instrument "JNM-EX270" (manufactured by JEOL Ltd.).

3. Preparation of radiation-sensitive composition

Examples 11 to 26

The polymer (A), the acid generator (B), the acid diffusion controller (C), and the solvent (D) were mixed in a ratio shown in Tables 1-1, 1-2. The resulting solution was filtered through a membrane filter (pore size: 200 nm) to obtain composition solutions (radiation-sensitive compositions) of Examples 11 to 26.

The details of the polymer (A), the acid generator (B), the acid diffusion controller (C), and the solvent (D) are given below.

Polymer (A)

(A-1): polymer (A-1) obtained by Example 5
(A-2): polymer (A-2) obtained by Example 6
(A-3): polymer (A-3) obtained by Example 7
(A-4): polymer (A-4) obtained by Example 8
(A-5): polymer (A-5) obtained by Example 9
(A-6): polymer (A-6) obtained by Example 10

Acid Generator (B)

(B-1): triphenylsulfonium trifluoromethanesulfonate
(B-2): triphenylsulfonium nonafluoro-n-butanesulfonate
(B-3): triphenylsulfonium 1,1,2,2-tetrafluoro-2-(tetracyclo[4.4.0.1$^{2,5}$.1$^{7,10}$]dodecan-8-yl)ethanesulfonate
(B-4): triphenylsulfonium 1,1-difluoro-2-(bicyclo[2.2.1]heptan-2-yl)ethanesulfonate
(B-5): compound shown by the following formula (2x-16)
(B-6): compound shown by the following formula (2x-43)
(B-7): compound shown by the following formula (2x-19)
(B-8): compound shown by the following formula (2x-31)
(B-9): compound shown by the following formula (2x-21)

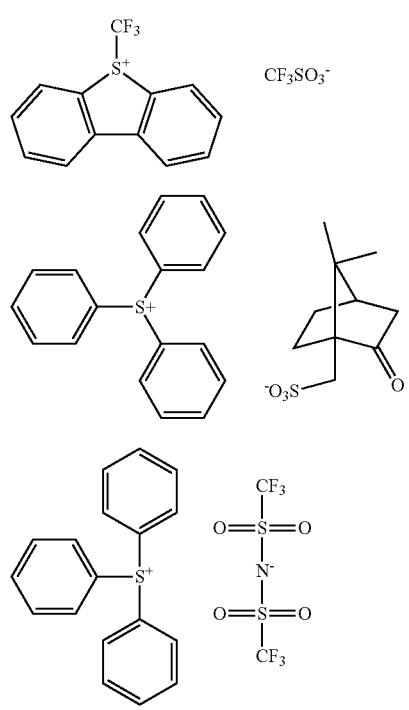

-continued

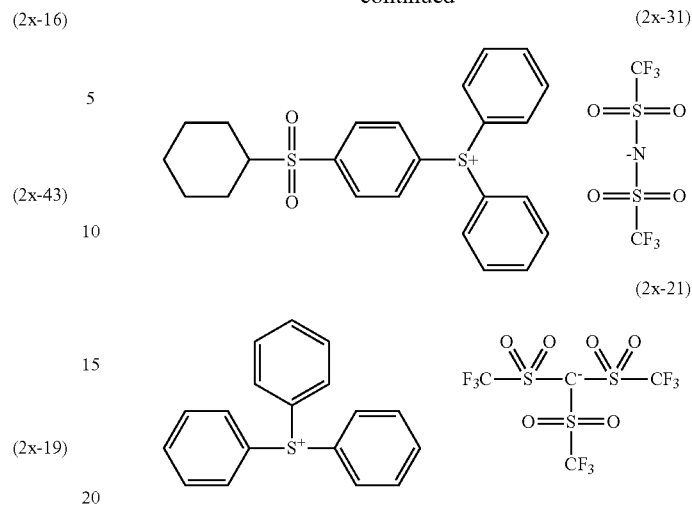

Acid Diffusion Controller (C)
(C-1): tri-n-octylamine
(C-2): triphenylsulfonium salicylate
(C-3): N-t-butoxycarbonyl-2-phenylbenzimidazole
Solvent (D)
(D-1): ethyl lactate
(D-2): propylene glycol monomethyl ether acetate
(D-3): cyclohexanone

TABLE 1-1

|  | Polymer (A) | | Acid generator (B) | | Acid diffusion controller (C) | | Solvent (D) | |
|---|---|---|---|---|---|---|---|---|
|  | Type | Amount (parts) | Type | Amount (parts) | Type | Amount (parts) | Type | Amount (parts) |
| Example 11 | A-1 | 100 | B-1 | 9 | C-1 | 1 | D-1 | 1400 |
|  |  |  |  |  |  |  | D-2 | 3300 |
| Example 12 | A-1 | 100 | B-1 | 9 | C-2 | 1 | D-1 | 1400 |
|  |  |  |  |  |  |  | D-2 | 3300 |
| Example 13 | A-1 | 100 | B-2 | 9 | C-2 | 1 | D-1 | 1400 |
|  |  |  |  |  |  |  | D-2 | 3300 |
| Example 14 | A-1 | 100 | B-3 | 9 | C-2 | 1 | D-1 | 1400 |
|  |  |  |  |  |  |  | D-2 | 3300 |
| Example 15 | A-1 | 100 | B-4 | 9 | C-2 | 1 | D-1 | 1400 |
|  |  |  |  |  |  |  | D-2 | 3300 |
| Example 16 | A-1 | 100 | B-5 | 9 | C-3 | 1 | D-1 | 1400 |
|  |  |  |  |  |  |  | D-2 | 3300 |
| Example 17 | A-1 | 100 | B-6 | 9 | C-2 | 2 | D-1 | 3300 |
|  |  |  |  |  |  |  | D-2 | 1400 |
| Example 18 | A-1 | 100 | B-7 | 10 | C-2 | 1 | D-1 | 1400 |
|  |  |  |  |  |  |  | D-2 | 3300 |
| Example 19 | A-1 | 100 | B-8 | 10 | C-2 | 1 | D-1 | 1400 |
|  |  |  |  |  |  |  | D-2 | 3300 |
| Example 20 | A-1 | 100 | B-6 | 10 | C-3 | 2 | D-1 | 3300 |
|  |  |  |  |  |  |  | D-2 | 1400 |

TABLE 1-2

|  | Polymer (A) | | Acid generator (B) | | Acid diffusion controller (C) | | Solvent (D) | |
|---|---|---|---|---|---|---|---|---|
|  | Type | Amount (parts) | Type | Amount (parts) | Type | Amount (parts) | Type | Amount (parts) |
| Example 21 | A-2 | 100 | B-6 | 9 | C-2 | 2 | D-1 | 3300 |
|  |  |  |  |  |  |  | D-2 | 1400 |
| Example 22 | A-1 | 100 | B-9 | 9 | C-1 | 1 | D-1 | 1400 |
|  |  |  |  |  |  |  | D-2 | 3300 |
| Example 23 | A-3 | 100 | B-6 | 18 | C-2 | 4 | D-1 | 3300 |
|  |  |  |  |  |  |  | D-2 | 1400 |

TABLE 1-2-continued

| | Polymer (A) | | Acid generator (B) | | Acid diffusion controller (C) | | Solvent (D) | |
|---|---|---|---|---|---|---|---|---|
| | Type | Amount (parts) | Type | Amount (parts) | Type | Amount (parts) | Type | Amount (parts) |
| Example 24 | A-4 | 100 | B-3 | 23 | C-2 | 4 | D-2 | 3300 |
| | | | | | | | D-3 | 1400 |
| Example 25 | A-5 | 100 | B-6 | 18 | C-2 | 4 | D-1 | 3300 |
| | | | | | | | D-2 | 1400 |
| Example 26 | A-6 | 100 | B-3 | 18 | C-2 | 4 | D-2 | 3300 |
| | | | | | | | D-3 | 1400 |
| Comparative Example 1 | A-3 | 100 | B-1 | 9 | C-1 | 1 | D-1 | 1400 |
| | | | | | | | D-2 | 3300 |
| Comparative Example 2 | A-3 | 100 | B-7 | 10 | C-2 | 1 | D-1 | 1400 |
| | | | | | | | D-2 | 3300 |

Comparative Examples 1 and 2

(1) Synthesis of polymer (A-7)

109.6 g of p-acetoxystyrene, 90.4 g of a compound (monomer) shown by the following formula (M-2), 6.8 g of AIBN, and 2.6 g of t-dodecylmercaptan were dissolved in 200 g of propylene glycol monomethyl ether, and polymerized for 16 hours at 70° C. in a nitrogen atmosphere. After completion of polymerization, the reaction solution was added dropwise to 10,000 g of n-hexane to coagulate and purify the copolymer. After the addition of 150 g of propylene glycol monomethyl ether to the copolymer, 300 g of methanol, 80 g of triethylamine, and 15 g of water were added to the mixture. The mixture was hydrolyzed for 8 hours under reflux at the boiling point. After completion of the reaction, the solvent and triethylamine were evaporated under reduced pressure. After dissolving the resulting copolymer in 200 g of acetone, the solution was added dropwise to 2000 g of water to coagulate the copolymer. A white powder thus produced was filtered, and dried overnight at 50° C. under reduced pressure.

The resulting copolymer had an Mw of 11,000 and an Mw/Mn ratio of 2.1. The molar ratio of the repeating units derived from p-hydroxystyrene and the repeating units derived from the compound shown by the formula (M-2) determined by $^{13}$C-NMR analysis was 65:35. This copolymer is referred to as a polymer (A-7).

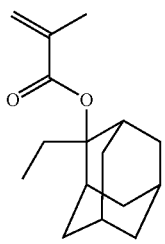

(M-2)

(2) Preparation of Radiation-Sensitive Composition

The polymer (A), the acid generator (B), the acid diffusion controller (C), and the solvent (D) were mixed in a ratio shown in Tables 1-1, 1-2. The resulting solution was filtered through a membrane filter (pore size: 200 nm) to obtain composition solutions (radiation-sensitive compositions) of Comparative Examples 1 and 2.

The details of the polymer (A), the acid generator (B), the acid diffusion controller (C), and the solvent (D) are given below.
Polymer (A)
(A-7): polymer (A-7)
Acid Generator (B)
(B-1): triphenylsulfonium trifluoromethanesulfonate
(B-7): compound shown by formula (2x-19)

Acid Diffusion Controller (C)
(C-1): tri-n-octylamine
(C-2): triphenylsulfonium salicylate
Solvent (D)
(D-1): ethyl lactate
(D-2): propylene glycol monomethyl ether acetate
4. Evaluation of Radiation-Sensitive Composition Each composition solution (radiation-sensitive compositions of Examples 11 to 26 and Comparative Examples 1 and 2) was spin-coated onto a silicon wafer using an instrument "Clean Track ACT-8" (manufactured by Tokyo Electron, Ltd.), and pre-baked (PB) under conditions shown in Table 2 to form a resist (radiation-sensitive composition) film having a thickness of 60 nm. The resist film was irradiated with electron beams using an electron beam drawing system ("HL800D" manufactured by Hitachi, Ltd., output: 50 KeV, current density: 5.0 A/cm$^2$). The resist film was then subjected to post-exposure bake (PEB) under conditions shown in Table 2. The resist film was then developed at 23° C. for 1 minute by a paddle method using a 2.38% tetramethylammonium hydroxide aqueous solution, washed with purified water, and dried to obtain a resist pattern. The resist thus obtained was evaluated by the following methods. The evaluation results of the radiation-sensitive compositions of Examples 11 to 26 and Comparative Examples 1 and 2 are shown in Table 2.

(1) Sensitivity (L/S)

A dose at which a line-and-space pattern (1L1S) including a line area (width: 150 nm) and a space area (groove) (width: 150 nm) formed between the adjacent line areas was formed at a line width of 1:1 is defined as an optimum dose, and the sensitivity was evaluated based on the optimum dose.

Figure 2:
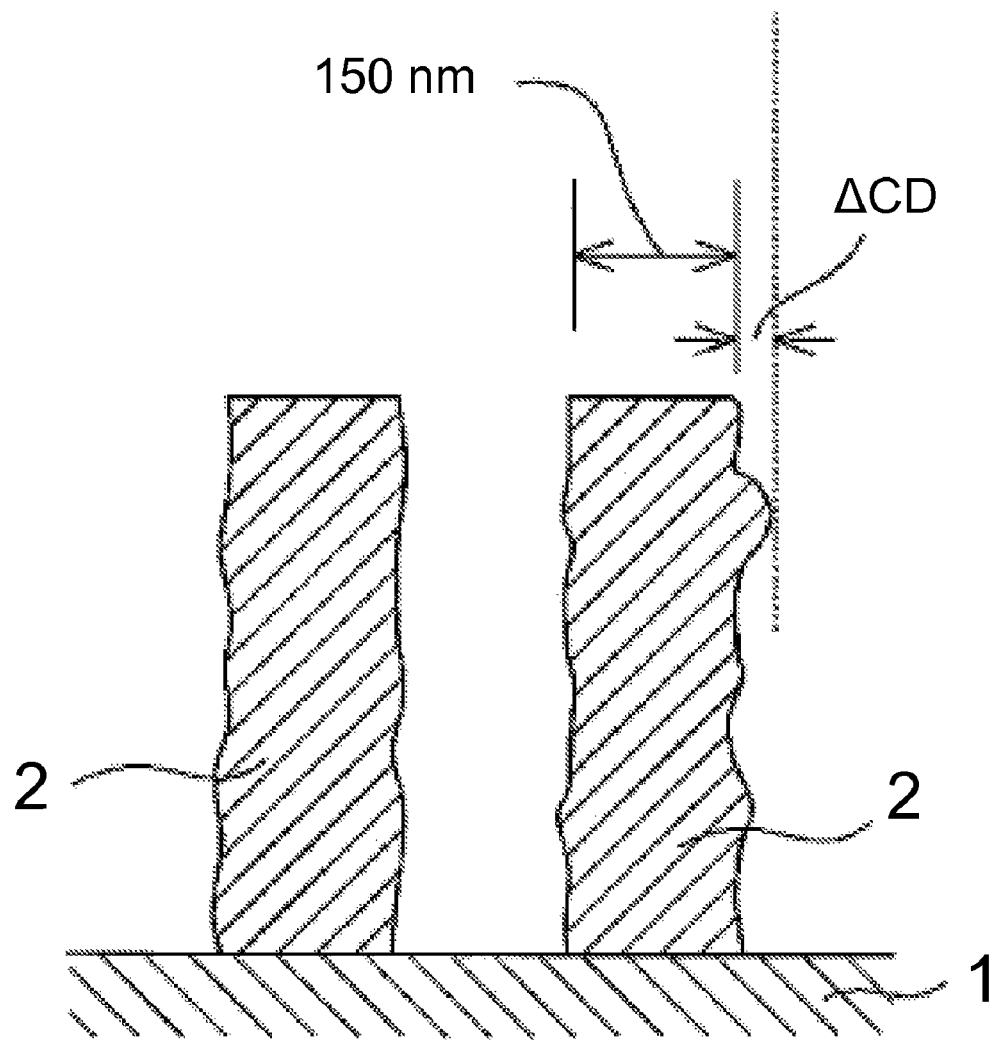
FIG. 2 is a cross-sectional view schematically showing the shape of a line pattern.

FIG. 1 is a plan view schematically showing the shape of a line-and-space pattern. FIG. 2 is a cross-sectional view schematically showing the shape of the line-and-space pattern. Note that elevations and depressions are exaggerated in FIGS. 1 and 2.

(2) Nano Edge Roughness

The line pattern of a line-and-space pattern (1L1S) (design line width: 150 nm) was observed using a scanning electron microscope ("S-9220" manufactured by Hitachi, Ltd.). The nano edge roughness was evaluated by determining a difference "ΔCD" between the design line width (150 nm) and the line width in an area where elevations and depressions significantly occurred along a side 2a of a line area 2 of a resist film formed on a silicon wafer 1 (see FIGS. 1 and 2) using a CD-scanning electron microscope (SEM) ("S-9220" manufactured by Hitachi High-Technologies Corporation).

(3) Resolution (L/S)

The minimum line width (nm) of a line pattern of a line-and-space pattern (1L1S) that was resolved at the optimum dose was taken as the resolution.

TABLE 2

|  | PB conditions | | PEB conditions | | | Nano edge | |
|---|---|---|---|---|---|---|---|
|  | Temperature (°C.) | Time (s) | Temp. (°C.) | Time (s) | Sensitivity (μC/cm²) | roughness (nm) | Resolution (nm) |
| Example 11 | 130 | 90 | 80 | 90 | 24.0 | 12 | 70 |
| Example 12 | 130 | 90 | 80 | 90 | 23.0 | 12 | 70 |
| Example 13 | 130 | 90 | 80 | 90 | 23.0 | 11 | 70 |
| Example 14 | 130 | 90 | 80 | 90 | 21.0 | 10 | 60 |
| Example 15 | 130 | 90 | 80 | 90 | 23.0 | 10 | 60 |
| Example 16 | 130 | 90 | 80 | 90 | 16.0 | 10 | 70 |
| Example 17 | 130 | 90 | 90 | 90 | 25.0 | 10 | 60 |
| Example 18 | 130 | 90 | 80 | 90 | 23.0 | 10 | 60 |
| Example 19 | 130 | 90 | 80 | 90 | 22.0 | 11 | 70 |
| Example 20 | 130 | 90 | 110 | 90 | 22.0 | 11 | 60 |
| Example 21 | 130 | 90 | 90 | 90 | 22.0 | 9 | 60 |
| Example 22 | 130 | 90 | 80 | 90 | 25.0 | 12 | 70 |
| Example 23 | 130 | 90 | 110 | 90 | 21.0 | 9 | 50 |
| Example 24 | 130 | 90 | 100 | 90 | 21.0 | 10 | 60 |
| Example 25 | 70 | 90 | 70 | 90 | 26.0 | 12 | 70 |
| Example 26 | 130 | 90 | 110 | 90 | 22.0 | 11 | 60 |
| Comparative Example 1 | 130 | 90 | 80 | 90 | 35.0 | 16 | 100 |
| Comparative Example 2 | 130 | 90 | 80 | 90 | 34.0 | 15 | 110 |

As shown in Table 2, it was confirmed that the radiation-sensitive compositions of Examples 11 to 26 including the polymers (A-1) to (A-6) can produce a chemically-amplified positive-tone resist film that effectively responds to electron beams or extreme ultraviolet rays, shows only a small degree of roughness and excellent sensitivity and resolution, and accurately and stably produces a fine pattern, as compared with the radiation-sensitive compositions of Comparative Examples 1 and 2 including the polymer (A-7).

Since the radiation-sensitive composition according to the embodiment of the invention exhibits high resolution when forming a line-and-space pattern and shows only a small degree of nano edge roughness, the radiation-sensitive composition may be useful when forming a fine pattern using EB, EUV, or X-rays. Therefore, the radiation-sensitive composition may be useful as a material for forming a chemically-amplified resist for producing semiconductor devices which are expected to be further scaled down in the future.

The radiation-sensitive composition according to the embodiment of the invention may produce a chemically-amplified positive-tone resist film that effectively responds to (extreme) deep ultraviolet rays (e.g., KrF excimer laser light, ArF excimer laser light, or EUV), X-rays such as synchrotron radiation, or electron beams, shows only a small degree of nano edge roughness, exhibits excellent sensitivity and resolution, and stably and accurately produces a fine pattern.

The above radiation-sensitive composition may be easily obtained using the polymer according to the embodiment of the invention as an acid-dissociable group-containing polymer.

Obviously, numerous modifications and variations of the present invention are possible in light of the above teachings. It is therefore to be understood that within the scope of the appended claims, the invention may be practiced otherwise than as specifically described herein.

The invention claimed is:
1. A radiation-sensitive composition comprising:
(A) an acid-dissociable group-containing polymer;
(B) a radiation-sensitive acid generator; and
(C) an acid diffusion controller, the acid-dissociable group-containing polymer (A) comprising a repeating unit shown by a following general formula (1),

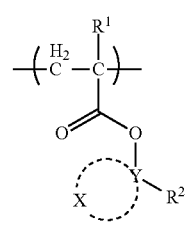

(1)

wherein $R^1$ represents a hydrogen atom, a methyl group, a fluorine atom, or a trifluoromethyl group, $R^2$ represents a substituted or unsubstituted aryl group having 6 to 22 carbon atoms, Y represents a carbon atom, and X represents an atomic group that forms an alicyclic hydrocarbon group together with Y, and wherein the content of the repeating unit (1) is from 1 mol % to 70 mol % based on the total amount (100 mol %) of the repeating units that form the polymer (A).

2. The radiation-sensitive composition according to claim 1, wherein the general formula (1) is a following general formula (1-1),

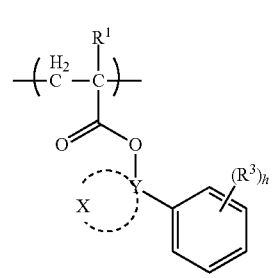

(1-1)

wherein $R^1$ represents a hydrogen atom, a methyl group, a fluorine atom, or a trifluoromethyl group, $R^3$ represents an alkyl group having 1 to 4 carbon atoms, Y represents a carbon atom, X represents an atomic group that forms an alicyclic hydrocarbon group together with Y, and h is an integer from 1 to 3.

3. The radiation-sensitive composition according to claim 1, wherein (B) the radiation-sensitive acid generator is an onium salt, a diazomethane compound, a sulfonimide compound, or a combination thereof.

4. A radiation-sensitive composition comprising:
(A) an acid-dissociable group-containing polymer; and
(B) a radiation-sensitive acid generator, the acid-dissociable group-containing polymer (A) comprising a repeating unit shown by a following general formula (1),

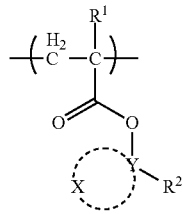
(1)

wherein $R^1$ represents a hydrogen atom, a methyl group, a fluorine atom, or a trifluoromethyl group, $R^2$ represents a substituted or unsubstituted aryl group having 6 to 22 carbon atoms, Y represents a carbon atom, and X represents an atomic group that forms an alicyclic hydrocarbon group together with Y, wherein the content of the repeating unit (1) is from 1 mol % to 70 mol % based on the total amount (100 mol %) of the repeating units that form the polymer (A), and wherein the radiation-sensitive acid generator (B) comprises an onium salt shown by a following general formula (b1), $$M^+Z^-$$ (b1)

wherein $M^+$ represents a monovalent onium cation, and $Z^-$ represents a monovalent anion shown by a following general formula (b1-Z-1) or (b1-Z-2),

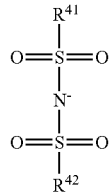
(b1-Z-1)

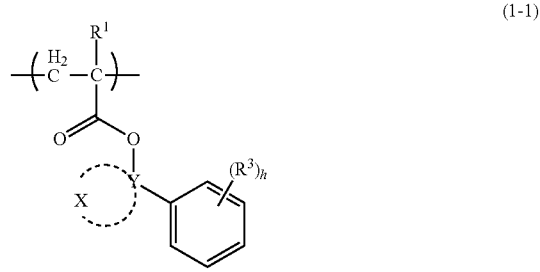
(b1-Z-2)

wherein $R^{41}$ and $R^{42}$ represent a fluorine atom or an alkyl group having 1 to 20 carbon atoms that is substituted with at least one fluorine atom, or bond to form a cyclic structure having 1 to 20 carbon atoms that is substituted with at least one fluorine atom, and $R^{43}$, $R^{44}$, and $R^{45}$ represent an alkyl group having 1 to 20 carbon atoms that is substituted with at least one fluorine atom, or two of $R^{43}$, $R^{44}$, and $R^{45}$ bond to form a cyclic structure having 1 to 20 carbon atoms that is substituted with at least one fluorine atom, and one of $R^{43}$, $R^{44}$, and $R^{45}$ other than the two of $R^{43}$, $R^{44}$, and $R^{45}$ represents an alkyl group having 1 to 20 carbon atoms that is substituted with at least one fluorine atom.

5. The radiation-sensitive composition according to claim 4, wherein the general formula (1) is a following general formula (1-1),

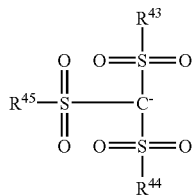
(1-1)

wherein $R^1$ represents a hydrogen atom, a methyl group, a fluorine atom, or a trifluoromethyl group, $R^3$ represents an alkyl group having 1 to 4 carbon atoms, Y represents a carbon atom, X represents an atomic group that forms an alicyclic hydrocarbon group together with Y, and h is 0.

* * * * *